(12) United States Patent
Chang et al.

(10) Patent No.: US 11,670,499 B2
(45) Date of Patent: Jun. 6, 2023

(54) METHOD OF FORMING CONDUCTIVE FEATURE INCLUDING CLEANING STEP

(71) Applicant: Taiwan Semiconductor Manufacturing Co., Ltd., Hsinchu (TW)

(72) Inventors: Cheng-Wei Chang, Taipei (TW); Min-Hsiu Hung, Tainan (TW); Chun-I Tsai, Hsinchu (TW); Ken-Yu Chang, Hsinchu (TW); Yi-Ying Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 142 days.

(21) Appl. No.: 17/205,847

(22) Filed: Mar. 18, 2021

(65) Prior Publication Data
US 2022/0301858 A1 Sep. 22, 2022

(51) Int. Cl.
H01L 21/02 (2006.01)
H01L 21/768 (2006.01)

(52) U.S. Cl.
CPC .. *H01L 21/02068* (2013.01); *H01L 21/76877* (2013.01)

(58) Field of Classification Search
CPC ......... H01L 21/02068; H01L 21/02071; H01L 21/76877
USPC ................................. 438/629, 648, 667, 675
See application file for complete search history.

(56) References Cited

U.S. PATENT DOCUMENTS

| 5,451,291 A * | 9/1995 | Park ................... H01L 21/02063 257/E21.228 |
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2007/0232064 A1 * | 10/2007 | Oh .................... H01L 21/76814 438/906 |
| 2016/0189966 A1 * | 6/2016 | Kolics ............... H01L 21/02071 438/678 |
| 2020/0098623 A1 * | 3/2020 | Cheng ............... H01L 21/76877 |

* cited by examiner

Primary Examiner — Robert G Bachner
Assistant Examiner — Molly K Reida
(74) Attorney, Agent, or Firm — Slater Matsil, LLP

(57) ABSTRACT

A method of forming a semiconductor device includes forming a first conductive feature on a bottom surface of an opening through a dielectric layer. The forming the first conductive feature leaves seeds on sidewalls of the opening. A treatment process is performed on the seeds to form treated seeds. The treated seeds are removed with a cleaning process. The cleaning process may include a rinse with deionized water. A second conductive feature is formed to fill the opening.

20 Claims, 24 Drawing Sheets

METHOD OF FORMING CONDUCTIVE FEATURE INCLUDING CLEANING STEP

BACKGROUND

High-density integrated circuits, such as Very Large Scale Integration (VLSI) circuits, are typically formed with multiple metal interconnects to serve as three-dimensional wiring line structures. The purpose of the multiple interconnects is to properly link densely packed devices together. With increasing levels of integration, a parasitic capacitance effect between the metal interconnects, which leads to RC delay and cross-talk, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

As feature sizes continue to shrink in advanced semiconductor manufacturing process, new challenges arise for semiconductor manufacturing. There is a need in the art for structures and methods for interconnect structures that are suitable for advanced semiconductor manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
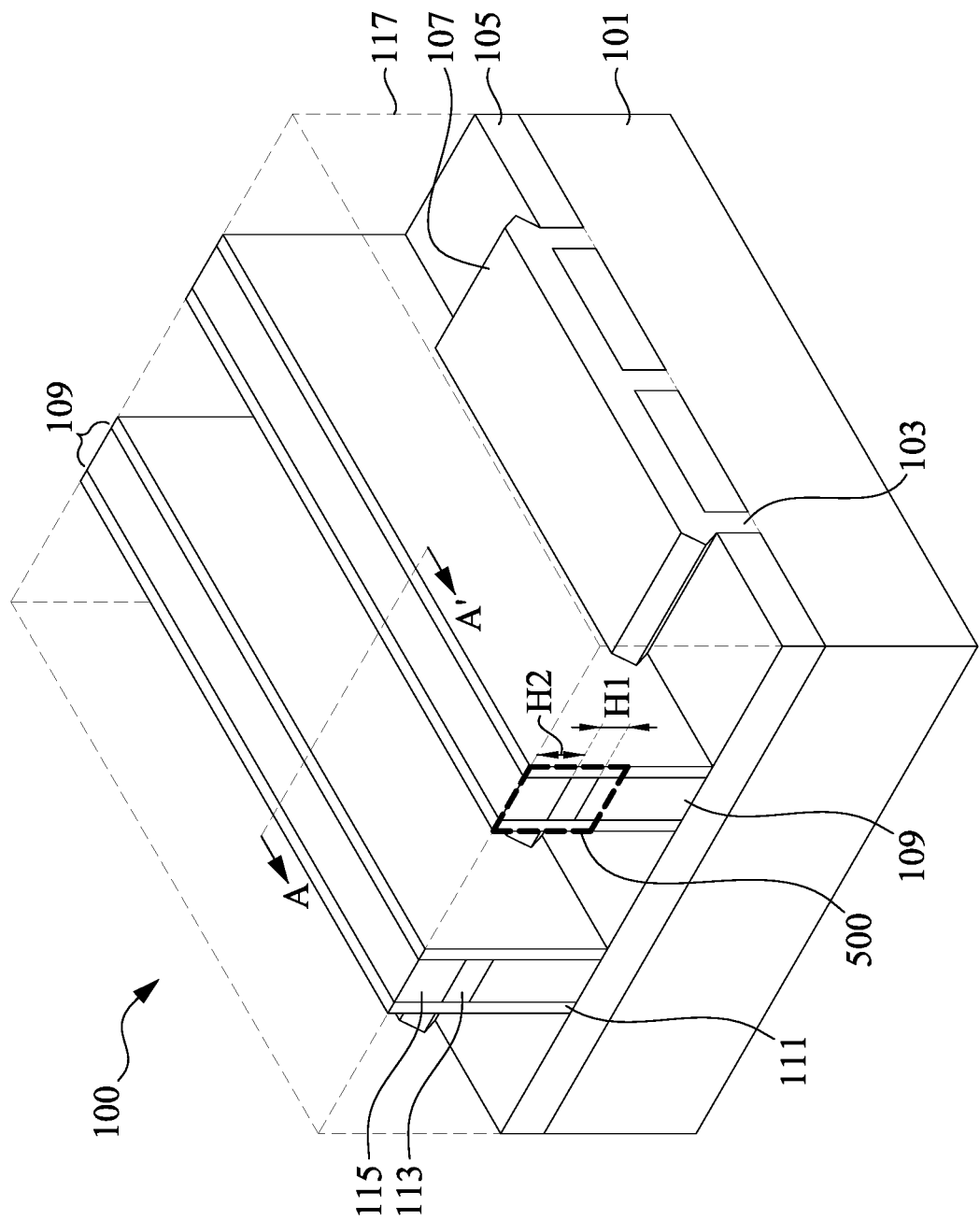
FIG. 1A illustrates a three-dimensional view of a semiconductor device at an intermediate stage of manufacturing, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment including an interconnect structure of a semiconductor device and the method of forming the same. In some embodiments a seed relocation process may be performed to improve via formation and reduce selective loss. However, the embodiments described herein are intended to be illustrative and not exclusive, as the ideas presented herein may be utilized in a wide variety of applications.

Figure 1B:
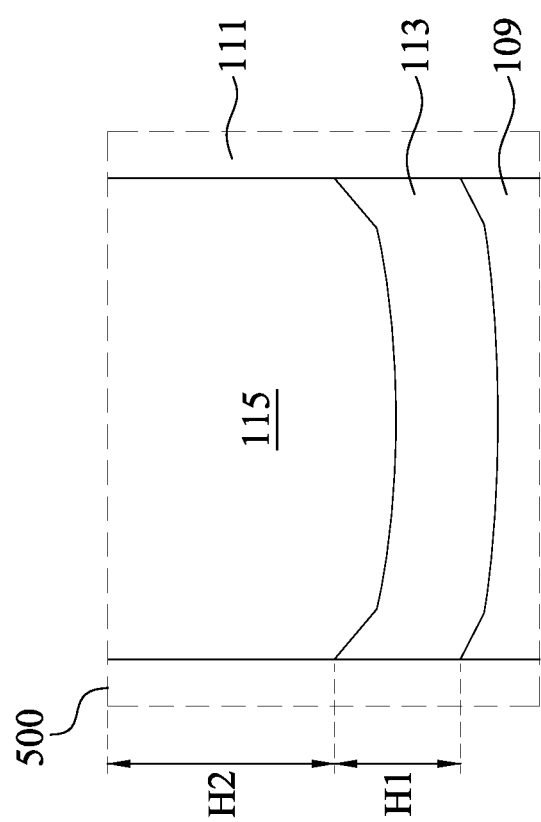
FIG. 1B illustrates a detailed cross-sectional view of a semiconductor device at an intermediate stage of manufacturing, in accordance with some embodiments.

FIG. 1A illustrates a perspective view of a semiconductor device 100 such as a FinFET device, in accordance with some embodiments. FIG. 1B illustrates a detailed cross-sectional view of region 500 as shown in FIG. 1A. The semiconductor device 100 may be a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

In the embodiments in which the device wafer is utilized, the semiconductor device 100 includes a semiconductor substrate 101 (also referred to as a substrate). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the semiconductor substrate 101, e.g., in the front-end-of-line (FEOL) processing of semiconductor manufacturing. In the example of FIG. 1A, semiconductor fins 103 (also referred to as fins) are formed protruding above the semiconductor substrate 101. Isolation regions 105, such as shallow-trench isolation (STI) regions, are formed between or around the semiconductor fins 103 using, for example, a deposition process followed by a planarization process and recessing of the deposited material.

After the isolation regions 105 have been formed, a dummy gate dielectric, a dummy gate electrode over the dummy gate dielectric, and gate spacers 111 may be formed over each of the semiconductor fins 103. In some embodiments, the dummy gate dielectric may be formed by thermal oxidation, chemical vapor deposition, sputtering, or any other methods known and used in the art for forming a gate dielectric. The dummy gate dielectric may comprise a material such as silicon dioxide, silicon oxynitride, and/or a high-k material. However, any suitable material may be used for the dummy gate dielectric. The dummy gate electrode may comprise a conductive material and may be selected from a group comprising of polysilicon, W, Al, Cu, Ti, TiAlN, TaC, TaCN, TaSiN, Mn, Zr, TiN, Ta, TaN, Co, Ni, combinations of these, or the like. The dummy gate electrode may be deposited by chemical vapor deposition (CVD), sputter deposition, or other techniques known and used in the art for depositing conductive materials.

Once formed, the dummy gate dielectric and the dummy gate electrode may be patterned to form a series of stacks over the semiconductor fins 103. The stacks define multiple channel regions located on each side of the semiconductor fins 103 beneath the dummy gate dielectric. The stacks may be formed by depositing and patterning a gate mask on the dummy gate electrode using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride. The dummy gate electrode and the dummy gate dielectric may be etched using a dry etching process to form the patterned stacks.

Once the stacks have been patterned, the gate spacers 111 may be formed. The gate spacers 111 may be formed on opposing sides of the stacks. The gate spacers 111 may be formed, for example, by blanket depositing a spacer layer (not separately illustrated in FIG. 1A) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the isolation regions 105. In some embodiments, the gate spacers 111 comprise multiple spacer layers, such as e.g. gate seal spacers and one or more gate spacer layers. The gate spacers 111 may then be patterned, such as by one or more etches to remove the spacer layer from the horizontal surfaces of the structure, to form the gate spacers 111.

After the formation of the gate spacers 111, portions of the semiconductor fins 103 from those areas not protected by the stacks and the gate spacers 111 are removed. The removal of the semiconductor fins 103 from those areas not protected by the stacks and the gate spacers 111 may be performed by a reactive ion etch (RIE) using the stacks and the gate spacers 111 as hard masks, or by any other suitable removal process. The removal may be continued until the semiconductor fins 103 are either planar with (as illustrated) or below the surface of the isolation regions 105.

Once these portions of the semiconductor fins 10 have been removed, a hard mask is placed and patterned to cover the dummy gate electrode to prevent growth and the source/drain regions 107 may be regrown in contact with each of the semiconductor fins 103. In an embodiment the source/drain regions 107 may be regrown and, in some embodiments the source/drain regions 107 may be regrown to form a stressor that will impart a stress to the channel regions of the semiconductor fins 103 located underneath the stacks. In an embodiment wherein the semiconductor fins 103 comprise silicon and the FinFET is a p-type device, the source/drain regions 107 may be regrown through a selective epitaxial process with a material, such as silicon or else a material such as silicon germanium that has a different lattice constant than the channel regions.

Additionally at this point the hard mask that covered the dummy gate electrode during the formation of the source/drain regions 107 is removed. In an embodiment the hard mask may be removed using, e.g., a wet or dry etching process that is selective to the material of the hard mask. However, any suitable removal process may be utilized.

Next, an inter-layer dielectric (ILD) layer 117 (illustrated in dashed lines in FIG. 1A in order to more clearly illustrate the underlying structures) may be formed over the stacks and the source/drain regions 107. The ILD layer 117 may comprise a material such as silicon oxide, phosphosilicate glass (PSG), borosilicate glass (BSG), boron-doped phosphosilicate glass (BPSG), fluorine-doped silicate glass (FSG), silicon oxide formed using a tetraethyl orthosilicate (TEOS) precursor, or the like. The ILD layer 117 may be formed using spin coating, Flowable Chemical Vapor Deposition (FCVD), Plasma Enhanced Chemical Vapor Deposition (PECVD), Low Pressure Chemical Vapor Deposition (LPCVD), or the like, although any suitable dielectrics may be used. Once formed, the ILD layer 117 may be planarized with the gate spacers 111 using, e.g., a planarization process such as a chemical mechanical polishing process, although any suitable process may be utilized.

After the planarization of the ILD layer 117, the material of the dummy gate electrode and the dummy gate dielectric may be removed, forming openings between the gate spacers 111 exposing the channel regions of semiconductor fins 103. In some embodiments the dummy gate electrode and the dummy gate dielectric may be removed using, e.g., wet or dry etching processes that utilizes etchants that are selective to the material of the dummy gate electrode and the dummy gate dielectric. In one embodiment the dummy gate electrode may be removed using a wet etchant such as dilute hydrofluoric acid and hydrogen peroxide. However, any suitable removal process may be utilized.

Next, gate structures 109 are formed over the channel regions of the semiconductor fins 103 in the openings between the gate spacers 111. Each of the gate structures 109 may be, e.g., a metal gate structure that includes a gate electrode, work function layer(s) around the gate electrode, and a gate dielectric layer around the work function layer(s). In some embodiments, the gate dielectric layers comprise one or more dielectric layers, such as one or more layers of silicon oxide, silicon nitride, metal oxide, metal silicate, or the like. The gate electrodes may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode is illustrated in FIG. 1A, the gate electrode may comprise any number of liner layers, any number of work function tuning layers, and a fill material. Each feature of the gate structures 109 may be deposited and then planarized, such as by a Chemical Mechanical Polish (CMP), to level the top surfaces of the features of the gate structures 109 with the top surfaces of the gate spacers 111. Once planarized, the materials of the gate structures 109 may then be recessed using, e.g., one or more wet or dry etching processes.

A capping layer 113 (e.g., a layer of tungsten) may be formed over the gate structure 109. The capping layer 113 can be formed using a selective deposition process that deposits the capping layer 113 on the metallic surfaces of the gate structures 109 but does not significantly deposit on dielectric surfaces.

In some embodiments, the selective deposition is a fluorine-free tungsten deposition, and hence, the capping layer 113 can be free of fluorine. In some embodiments, the selective deposition process, which further is a fluorine-free tungsten deposition, is an ALD process that uses a hydrogen ($H_2$) precursor and a tungsten chloride precursor. In other embodiments, the selective deposition process is a CVD process such as an MOCVD process using a tungsten chloride precursor. The tungsten chloride precursor can be tungsten pentachloride, tungsten hexachloride, another tungsten chloride, or a combination thereof. In some embodiments, the capping layer 113 is formed to a height H1 in a range of 2.5 nm to 3.3 nm. In some embodiments, as illustrated in accordance with FIG. 1B, the capping layer 113 has a concave shape with a curvature in a range of 0.18 to 0.37. However, any suitable dimensions may be utilized.

Further referring to FIGS. 1A and 1B, a mask layer 115 (e.g., silicon nitride), also referred to as a sacrificial layer, is formed over the capping layer 113. The mask layer 115 may be used to cover the capping layer 113 during a subsequent deposition of an etch stop layer (see below, FIG. 2). In some embodiments, the mask layer 115 is formed to a height H2 in a range of 12 nm to 29 nm. The mask layer 115 may be deposited by any suitable process.

FIGS. 2 through 17 illustrate cross-sectional views of FIG. 1A along line A-A' showing intermediate stages in the manufacture of the semiconductor device 100, with multiple additional gates structures 109 illustrated in this cross-section for clarity. The semiconductor device 100 may include regions 100A and 100B used to form difference types of devices. In some embodiments, region 100A is a logic region used to form logic devices such as e.g. CPUs or GPUs and region 100B is a memory region used to form memory devices such as e.g. SRAM cells.

Figure 2:
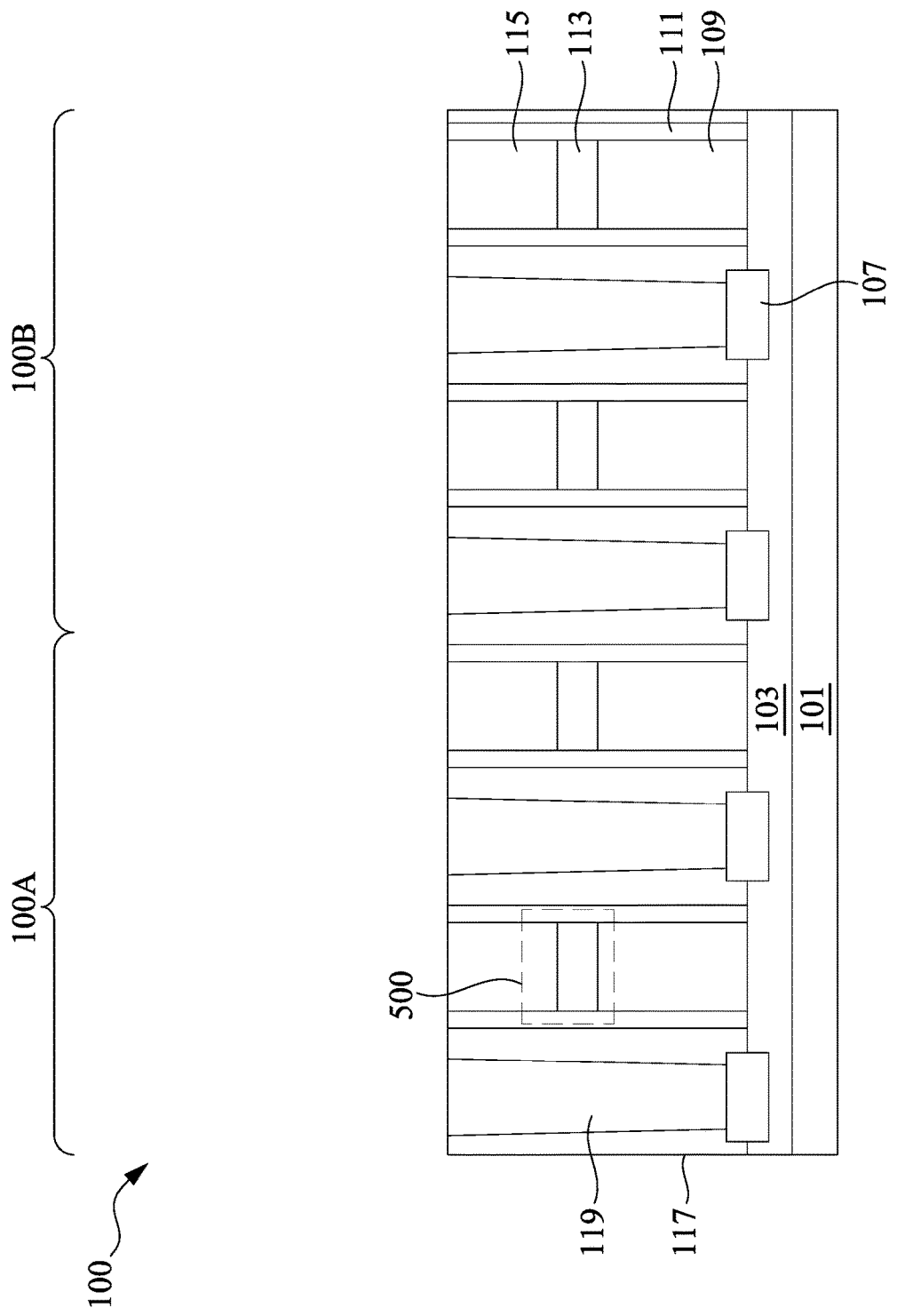
FIGS. 2 through 17 illustrate cross-sectional views of a semiconductor device at intermediate stages of manufacturing, in accordance with some embodiments.

FIG. 2 illustrates contact plugs 119, such as source/drain contacts, formed in the ILD layer 117. The contact plugs 119 electrically couple the source/drain regions 107 to subsequently formed conductive features such as metal lines, vias, and conductive pillars over the source/drain regions 107. In some embodiments, the contact plugs 119 are formed of a conductive material such as cobalt, tungsten, aluminum, copper, titanium, tantalum, titanium nitride, tantalum nitride, the like, or a combination thereof. The formation of the contact plugs 119 may include forming contact openings in the ILD layer 117 to expose the source/drain region 107, forming one or more conductive material(s) in the contact openings, and performing a planarization process, such as a Chemical Mechanical Polish (CMP), to level the top surface of the contact plugs 119 with the top surface of the ILD layer 117.

The disclosed FinFET embodiments may also be applied to nanostructure devices such as nanostructure (e.g., nanosheet, nanowire, gate-all-around, or the like) field effect transistors (nano-FETs). In an nano-FET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the nano-FET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 3:
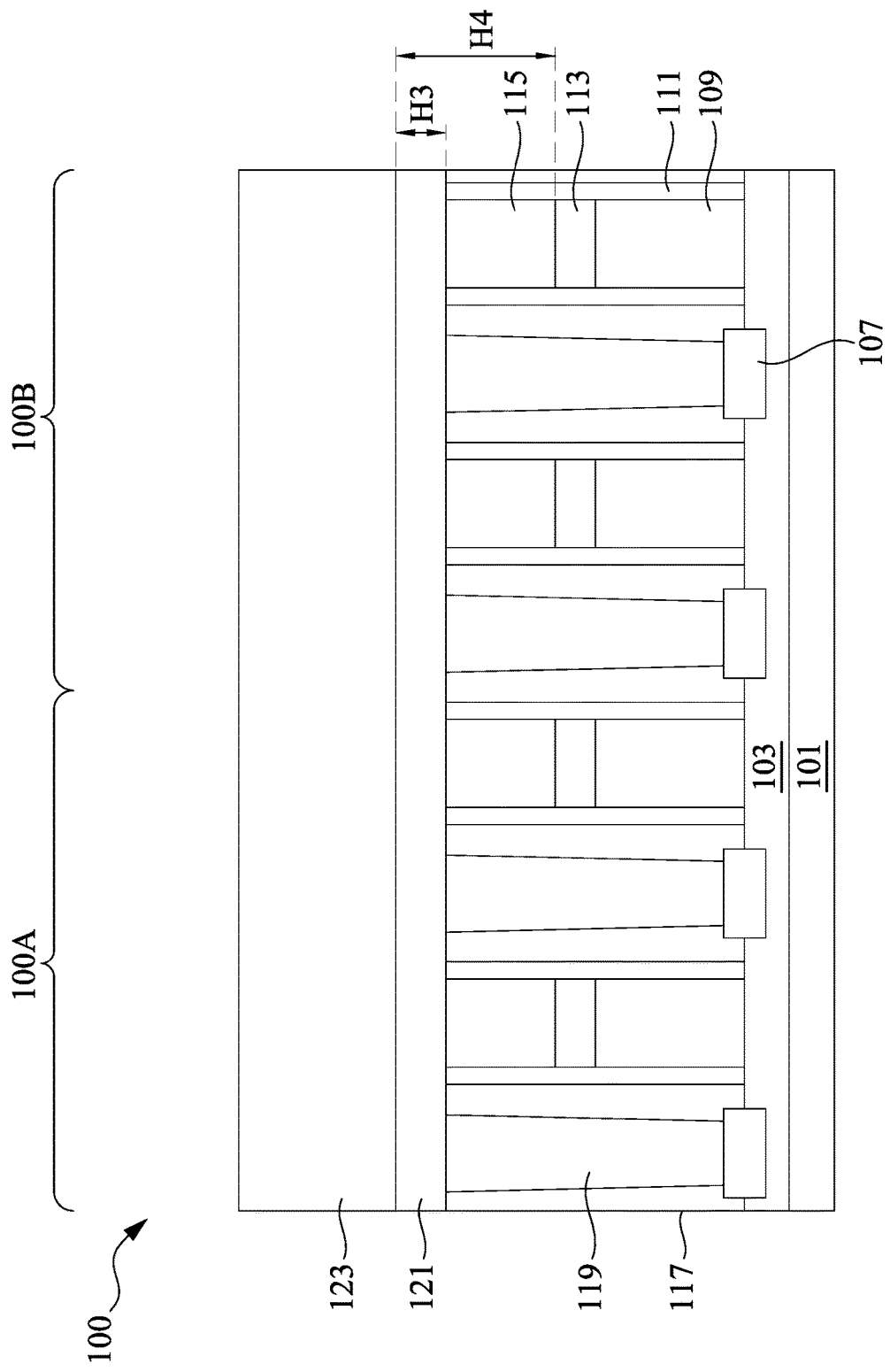

In FIG. 3, an etch stop layer (ESL) 121 and an Inter-Metal Dielectric (IMD) layer 123 are formed over the ILD layer 117, the contact plugs 119, the gate spacers 111, and the mask layer 115. In some embodiments, the ESL 121, also referred to as a middle contact ESL or MCESL, comprises silicon nitride formed by PECVD, although other dielectric materials such as nitride, carbide, combinations thereof, or the like, and other techniques of forming the ESL 121, such as LPCVD, PVD, or the like, could be used. In some embodiments, the ESL 121 is formed to a height H3 in a range of 8.1 nm to 10.3 nm. In some embodiments in which the mask layer 115 and the ESL 121 are both silicon nitride, the mask layer 115 and the ESL 121 may have a combined height H4 of SiN in a range of 22 nm to 28 nm. However, any suitable dimensions may be utilized.

Next, an Inter-Metal Dielectric (IMD) layer 123 is formed over the ESL 121 and over the ILD layer 117. The IMD layer 123 may be formed of a dielectric material such as silicon oxide, silicon nitride, silicon carbide, silicon oxynitride, a low-k dielectric material having a dielectric constant (k-value) lower than 3.0, such as about 2.5, about 2.0, or even lower, Black Diamond, a carbon-containing low-k dielectric material such as e.g. SiCOH, Hydrogen Silses-Quioxane (HSQ), MethylSilsesQuioxane (MSQ), the like, or a combination thereof. The formation of the IMD layer 123 may include CVD, PVD, ALD, or a process such as depositing a porogen-containing dielectric material over the ILD layer 117, and then performing a curing process to drive out the porogen, thereby forming the IMD layer 123 that is porous, as an example. However, any suitable materials and methods may be used to form the IMD layer 123.

Figure 4:
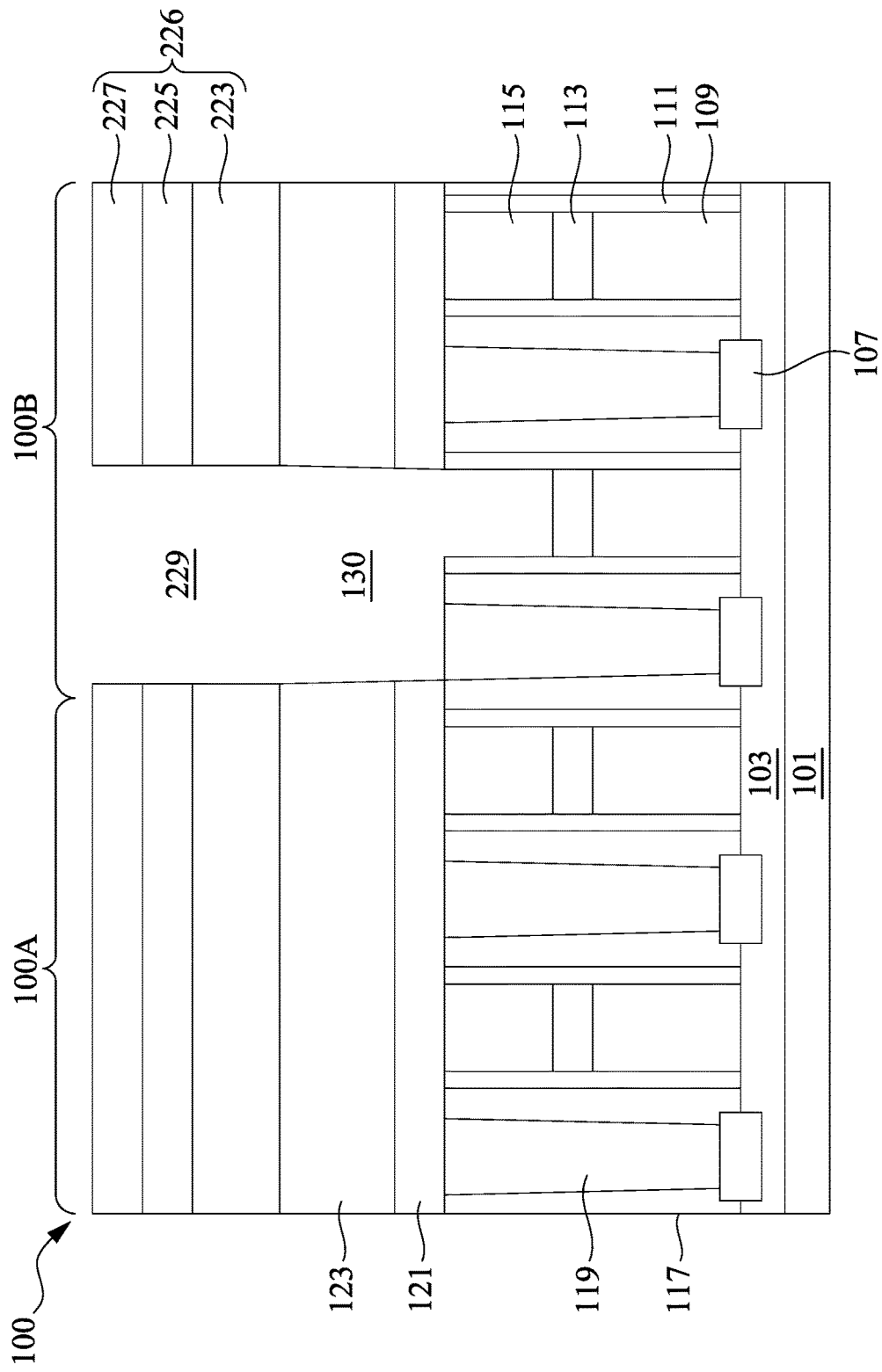

In FIG. 4, a photoresist 226, also referred to as a tri-layered photoresist, comprising a top photoresist layer 227, a middle layer 225, and a bottom anti-reflective coating (BARC) layer 223, is formed over the IMD layer 123. However, it should be understood that the photoresist 226 may comprise any suitable number of layers and materials. For example, in some embodiments, a tetra-layer photoresist may be formed.

In an embodiment in which the photoresist 226 is a tri-layered photoresist, the BARC layer 223 of the photoresist 226 may comprise an organic or inorganic material. The middle layer 225 may comprise silicon nitride, silicon oxynitride, or the like, that has an etch selectivity to the top photoresist layer 227, such that the top photoresist layer 227 can be used as a mask layer to pattern the middle layer 225. The top photoresist layer 227 may comprise a photosensitive material. Any suitable deposition method, such as PVD, CVD, spin coating, the like, or combinations thereof, may be used to form the photoresist 226.

Once the photoresist 226 is formed, a pattern 229 (e.g., an opening or openings) is formed in the top photoresist layer 227 in the region 100B. In some embodiments, the top photoresist layer 227 is patterned by exposing the photosensitive material within the top photoresist layer 227 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the top photoresist layer 227 are different from the physical properties of the unexposed portions of the top photoresist layer 227. The top photoresist layer 227 may then be developed with a developer to remove the exposed portion of the top photoresist layer 227 or the unexposed portion of the top photoresist layer 227, depending on, e.g., whether a negative photosensitive material or a positive photosensitive material is used for the top photoresist layer 227. The remaining portions of the top photoresist layer 227 form a patterned photoresist layer.

Next, the pattern 229 in the top photoresist layer 227 is extended through the middle layer 225 and the BARC layer 223, and is transferred to the IMD layer 123, the ESL 121, and the mask layer 115, forming an opening 130. In some embodiments, to transfer the patterns of the top photoresist layer 227, one or more anisotropic etching processes, such as one or more anisotropic plasma etching processes, are performed. The one or more anisotropic plasma etching processes may be reactive-ion etching (RIE) processes.

Figure 5:
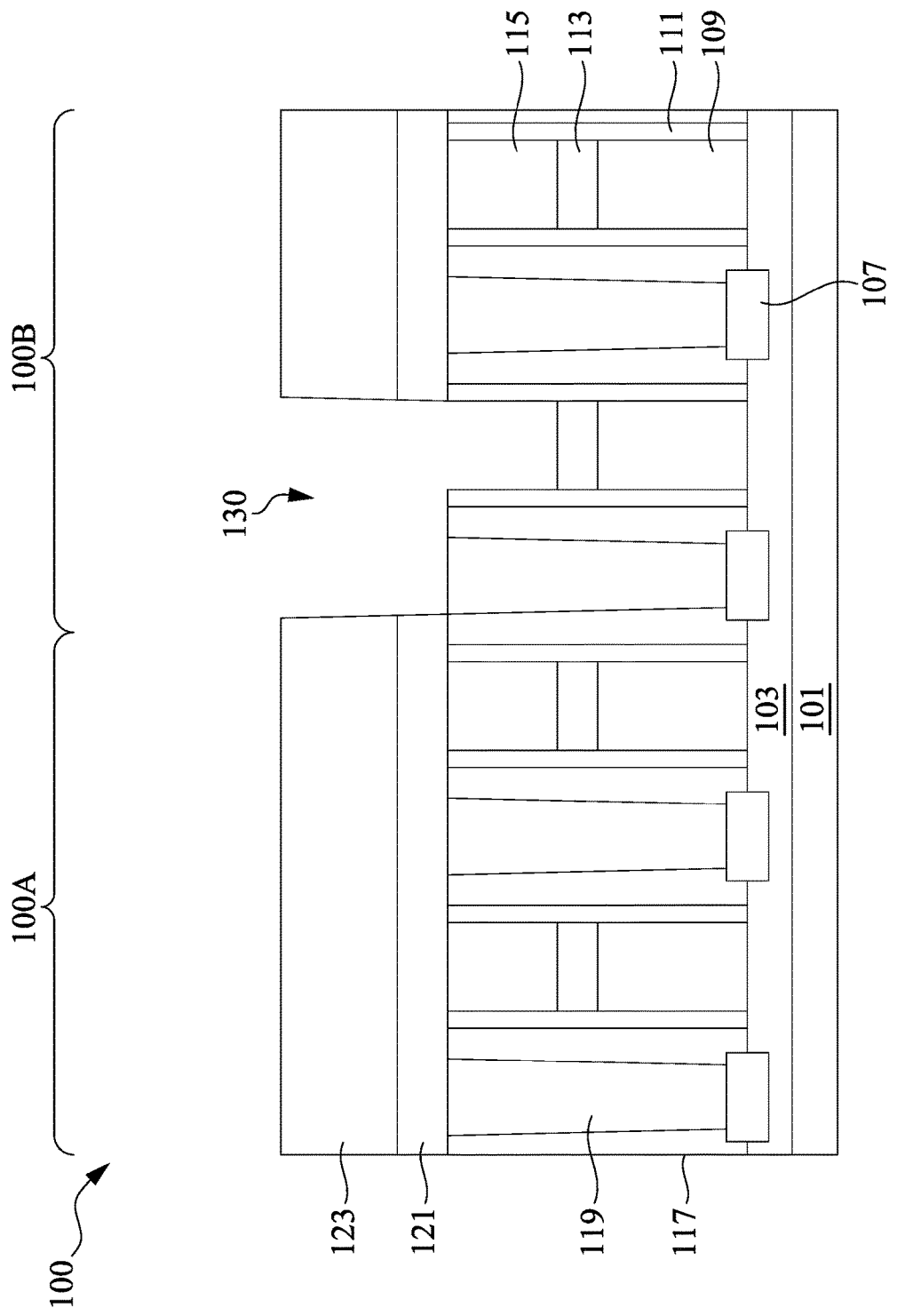

In FIG. 5, the photoresist 226 is removed from the top surface of the IMD layer 123. In some embodiments, an ashing process (e.g., a plasma process) is performed to remove the photoresist 226. The remaining opening 130 exposes top surfaces of a contact plug 119 and an adjacent capping layer 113 over one of the gate structures 109.

Figure 6:
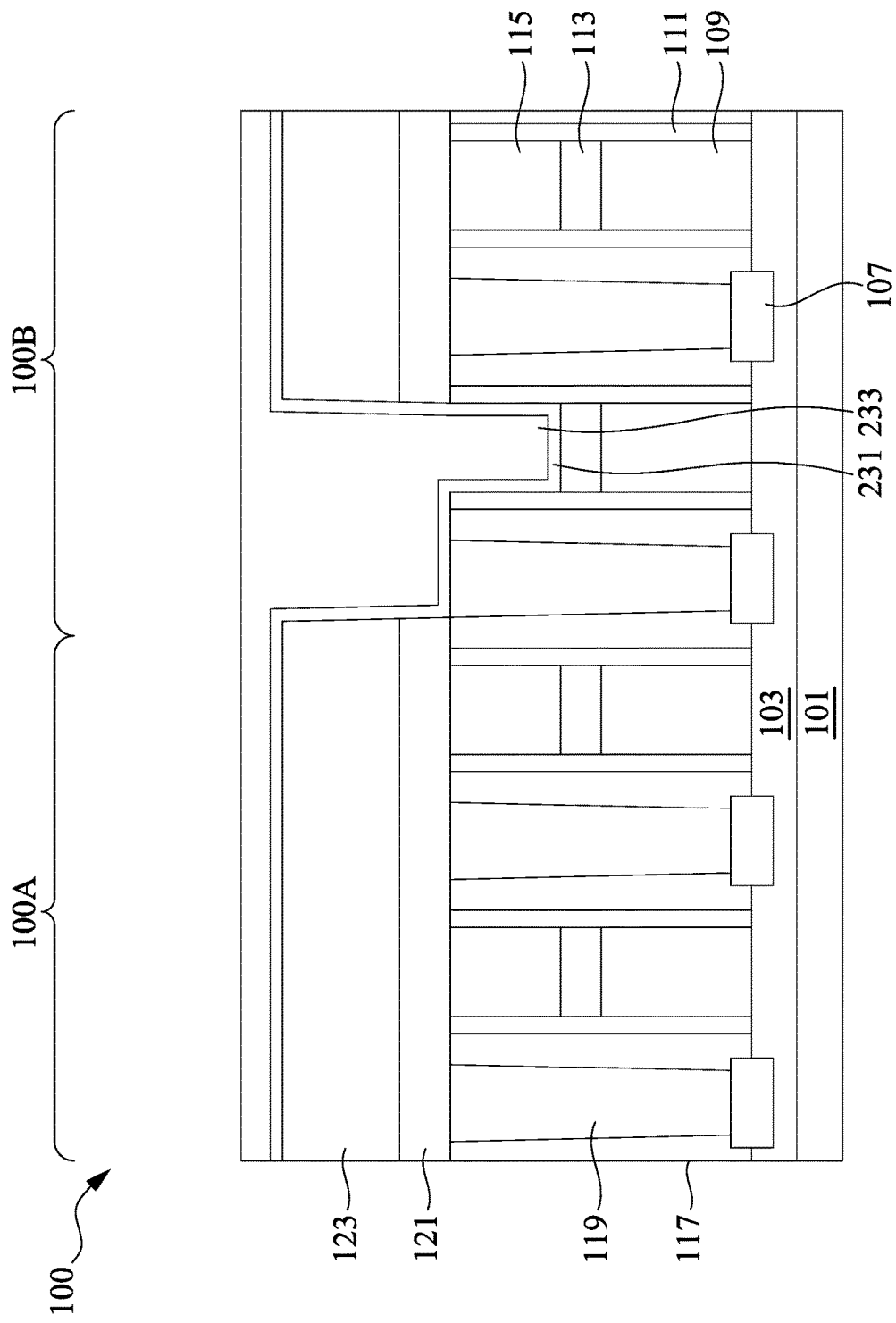

In FIG. 6, the opening 130 is first lined with a liner 231 such as a conductive diffusion barrier material then completely filled with a conductive fill material 233 deposited over the liner 231. The liner 231 is formed over bottom surfaces and sidewalls of the opening 130 and may extend over exposed surfaces of the capping layer 113, the contact plug 119, the gate spacer 111, the ILD layer 117, the ESL 121, and the IMD layer 123. The liner 231 comprises one or more layers of TaN, Ta, TiN, Ti, Co, or the like, or combinations thereof, and may be deposited by any suitable method, for example, CVD, PECVD, PVD, ALD, PEALD, ECP, electroless plating and the like.

In one particular embodiment, the liner 231 can comprise a bottom layer of Ti and a top layer of TiN, wherein the bottom layer of Ti is formed with a PVD process and the top layer of TiN is formed with a CVD process. An Ar plasma treatment pre-cleaning may be performed prior to forming the bottom layer of Ti and the top layer of TiN to remove a native oxide from the ambient atmosphere. The Ar plasma treatment pre-cleaning, the formation of the bottom layer of Ti, and the formation of the top layer of TiN may be performed in situ in the same mainframe as the PVD and CVD chambers.

After forming the liner 231, the conductive fill material 233 is deposited over the liner 231 to completely fill the opening 130. In some embodiments, the conductive fill material 233 comprises tungsten and is deposited with a selective ALD process. A precursor comprising tungsten and fluorine may be used for the selective ALD, such as e.g. $WF_6$, along with another precursor such as hydrogen. However, any suitable precursors and any suitable processes may be utilized.

Additionally, while the conductive fill material 233 can be tungsten deposited using the selective ALD process described above, in other embodiments the conductive fill material 233 may comprise metals such as Cu, Al, Co, Ru, or the like, or combinations thereof, or multi-layers thereof. In these embodiments, the conductive fill material 233 may be deposited by any suitable method, for example, CVD, PECVD, PVD, ALD, PEALD, ECP, electroless plating and the like. However, any suitable materials and processes may be utilized.

Figure 7:
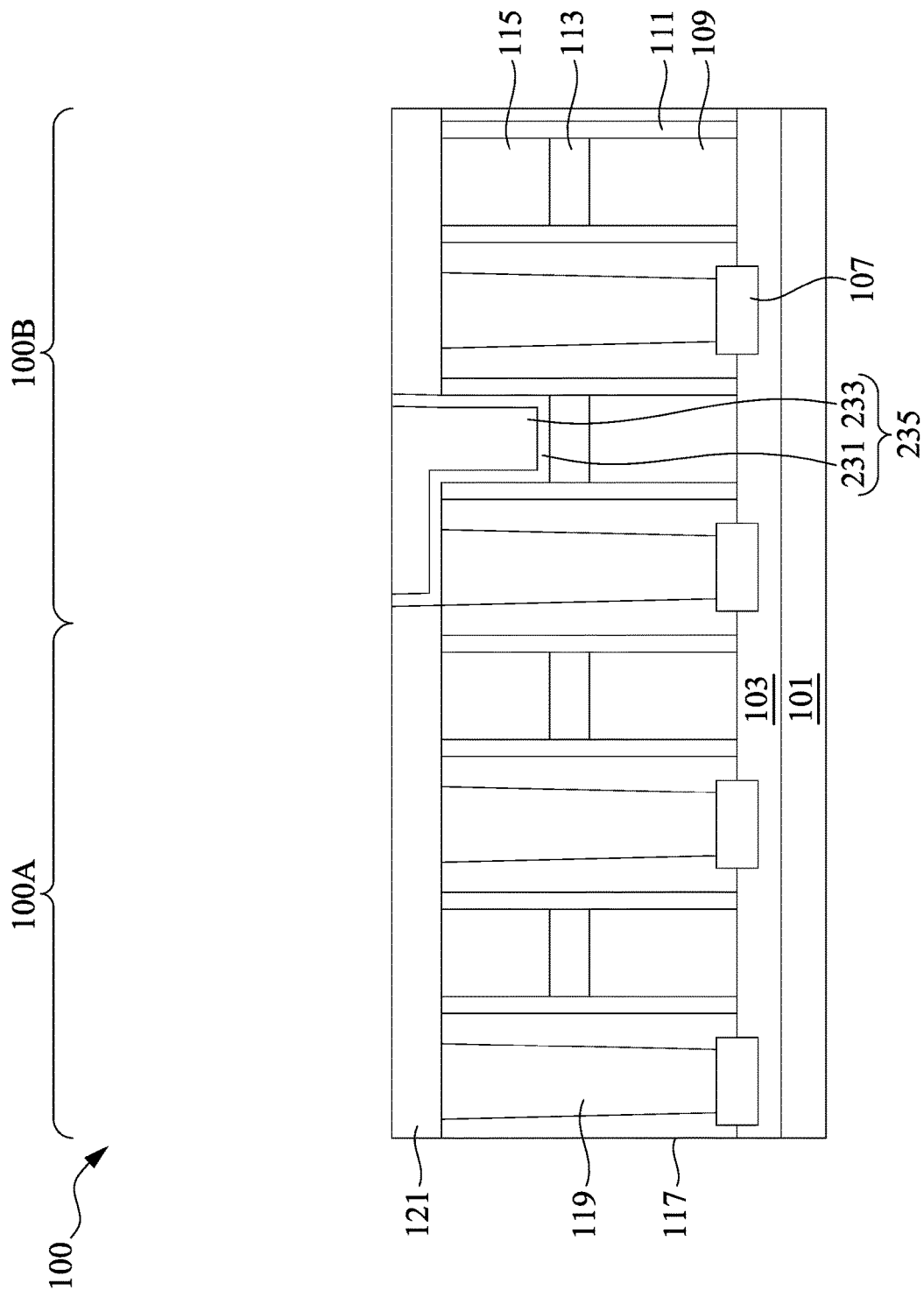

In FIG. 7, any excess conductive material over the ESL 121 outside of the opening 130 may be removed by a planarizing process such as e.g. a CMP. The planarization may also remove the IMD layer 123 over the ESL 121 in the regions 100A and 100B. The remaining portions of the liner 231 and the conductive fill material 233 form a butted contact 235 electrically coupled to the gate electrode of the gate structure 109 and the source/drain region 107 through the capping layer 113 and the contact plug 119, respectively. The butted contact 235 may be useful for forming circuitry in the region 100B, such as e.g. an SRAM cell, in some embodiments.

Figure 8:
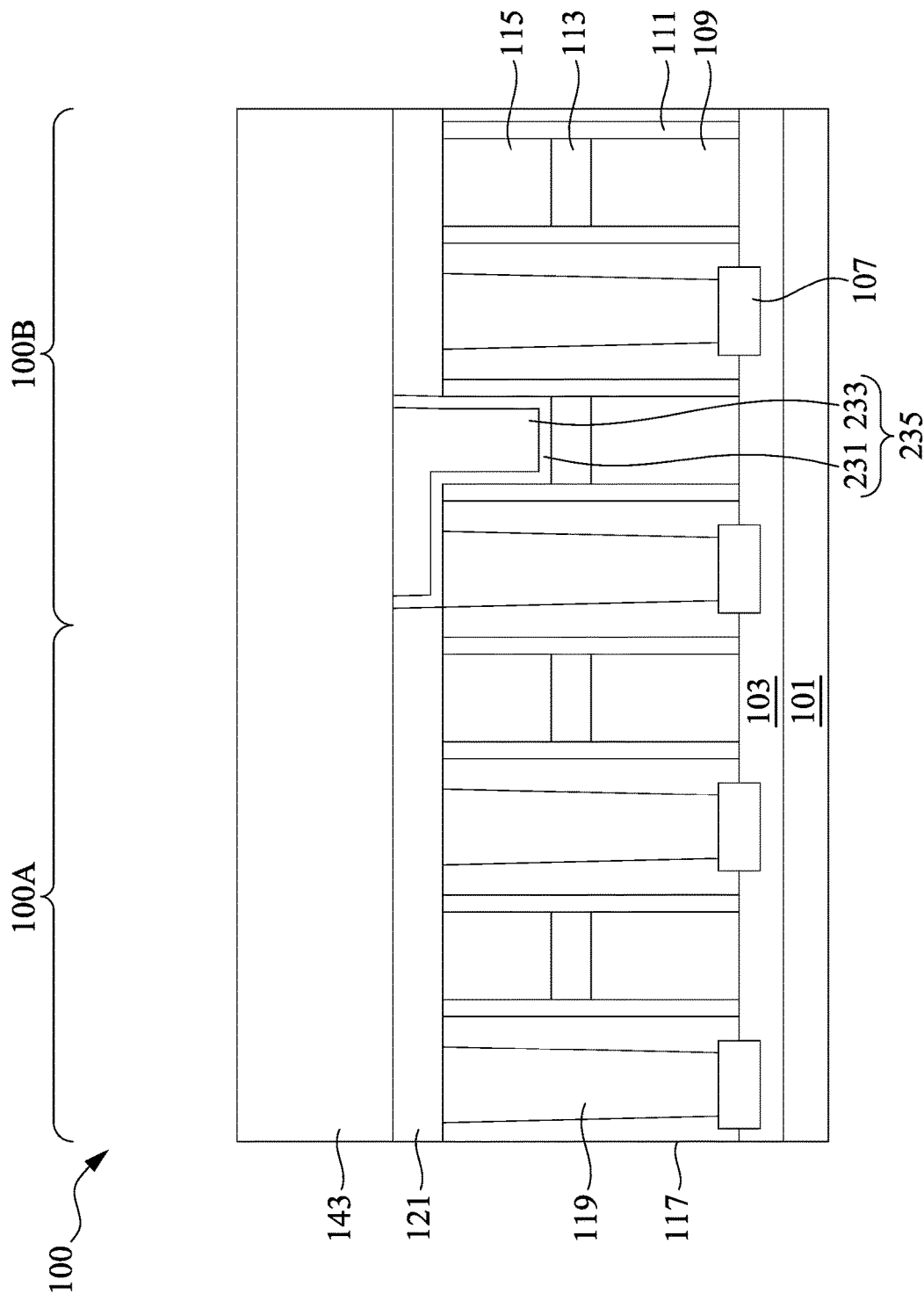

In FIG. 8, an IMD layer 143 is formed over the ESL 121 and the butted contact 235. The IMD layer 143 may be formed using similar processes and materials as the IMD layer 123 as described above with respect to FIG. 3. However, any suitable processes or materials may be used.

Figure 9A:
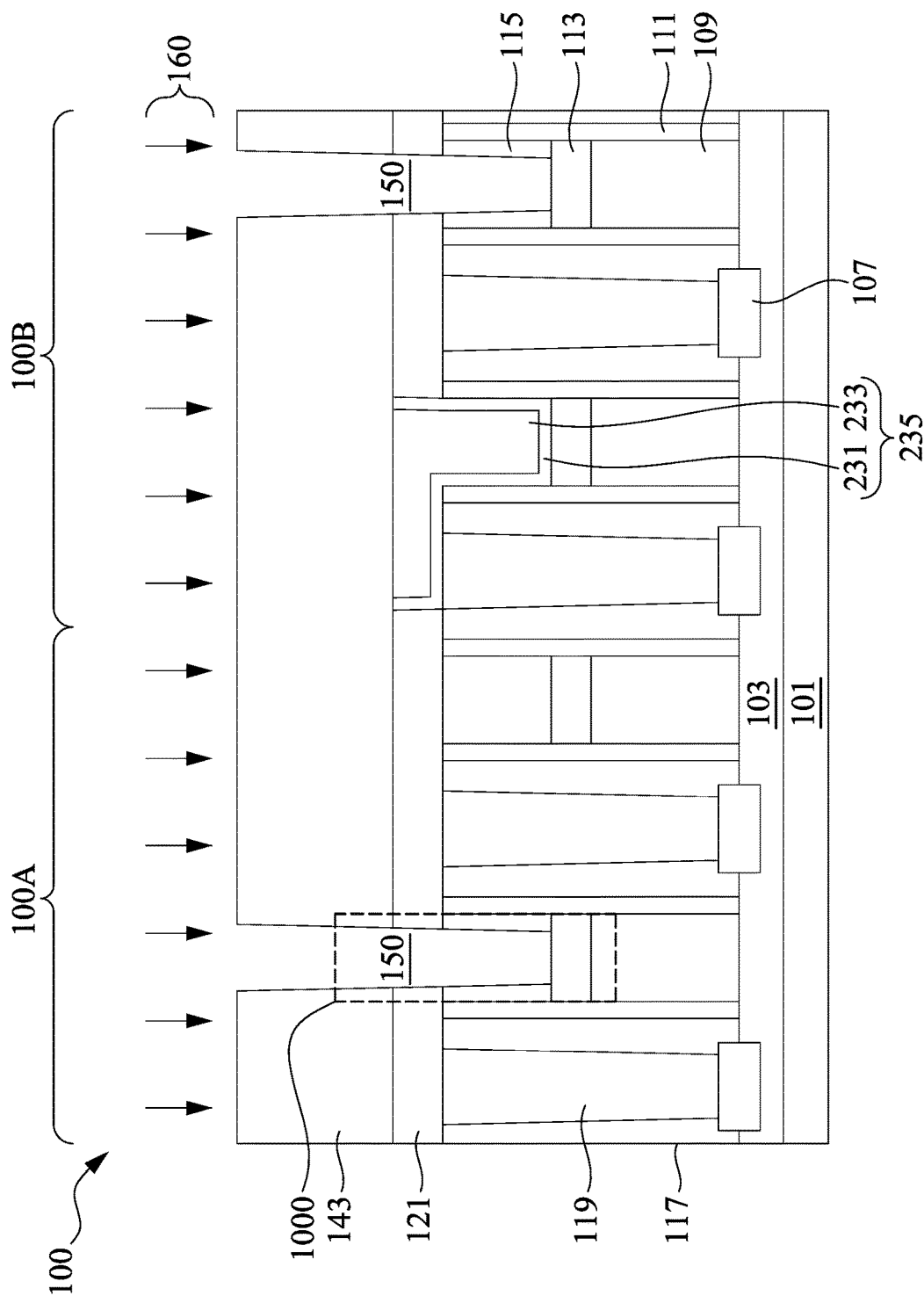
Figure 9B:
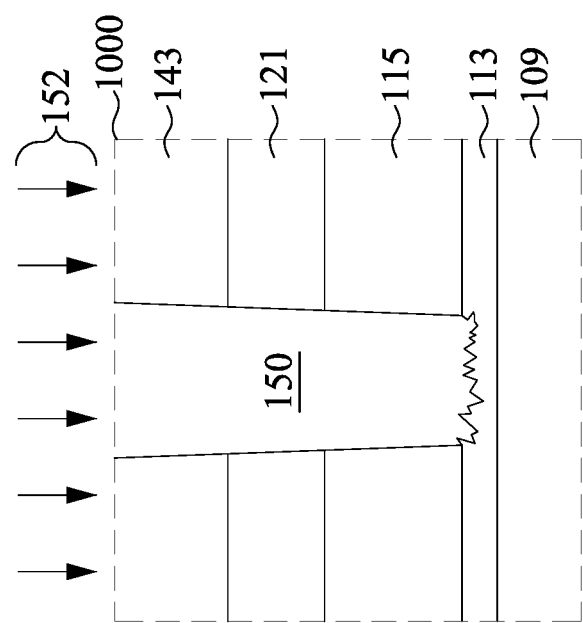

FIGS. 9A-9B illustrate the patterning of openings 150 through the IMD layer 143, the ESL 121, and the mask layer 115 to expose top surfaces of the capping layer 113 in regions 100A and 100B, with FIG. 9B illustrating a detailed view of region 1000 as shown in FIG. 9A. The openings 150 may be patterned using similar processes as the openings 130 as described above in respect to FIGS. 4 and 5. However, any suitable processes may be used.

After the patterning of the openings 150, an additional wet etch may be performed in order to shape the profiles of vias subsequently formed in the openings 150 (see below, FIGS. 13A and 13B) and to improve the removal of the mask layer 115 on the bottom surfaces of the openings 150. The wet etch may comprise etchants such as isopropyl alcohol (IPA), a mixture of deionized water (DIW) and ozone, e.g., ozonated DIW, $NH_4OH$, the like, or a combination thereof.

Subsequent to the patterning of the openings 150 and the wet etch, a plasma treatment 152 may be applied to the openings 150. The plasma treatment 152, which may be a directional plasma treatment, can achieve immobilization of the surface texture of the capping layer 113 and removal of residues from the previous patterning and/or wet etch steps. In some embodiments, the plasma treatment 152 comprises an $H_2$ plasma treatment followed by an $O_2$ plasma treatment, or an $O_2$ plasma treatment followed by an $H_2$ plasma treatment. The plasma treatment 152 may be performed at a temperature in a range of 113° C. to 120° C. However, any suitable parameters may be utilized.

Figure 10:
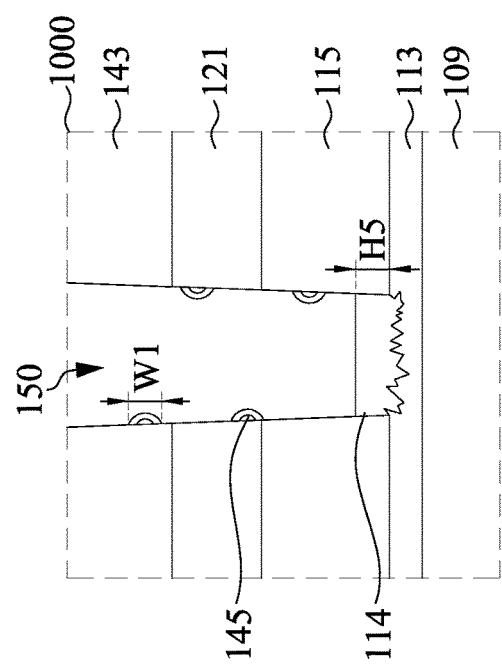

FIG. 10 illustrates formation of an additional capping layer 114 formed on a bottom surface of the opening 150. The additional capping layer 114 may be formed using similar processes and materials as the capping layer 113 as described above with respect to FIG. 1A, such as e.g. tungsten formed with a fluorine-free tungsten CVD, using a tungsten chloride precursor such as e.g. tungsten (V) chloride ($WCl_5$). In some embodiments, the additional capping layer 114 may have a height H5 in a range of 4.3 nm to 6.2 nm. However, any suitable dimensions may be utilized.

The formation of the additional capping layer 114 may also lead to the deposition of seeds 145, also referred to as a residue, on sidewalls of the opening 150. The seeds 145 may be attached to sidewalls of the mask layer 115, the ESL 121, and the IMD layer 143. In some embodiments, the seeds comprise tungsten and have widths W1 in a range of 1 nm to 4 nm.

Figure 12:
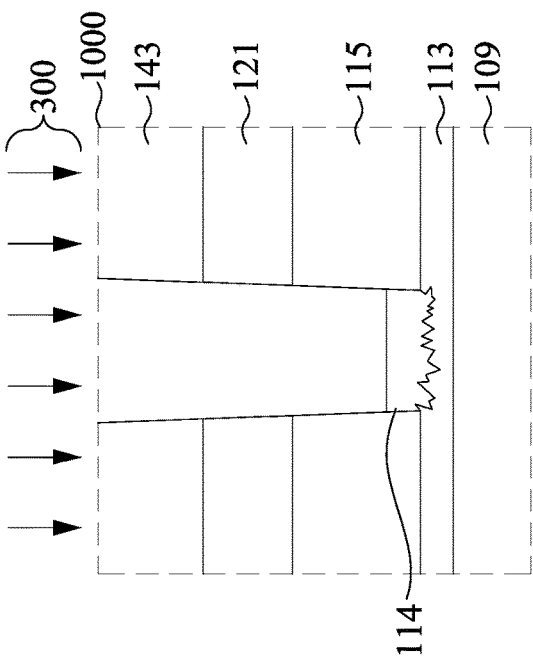
Figure 11:
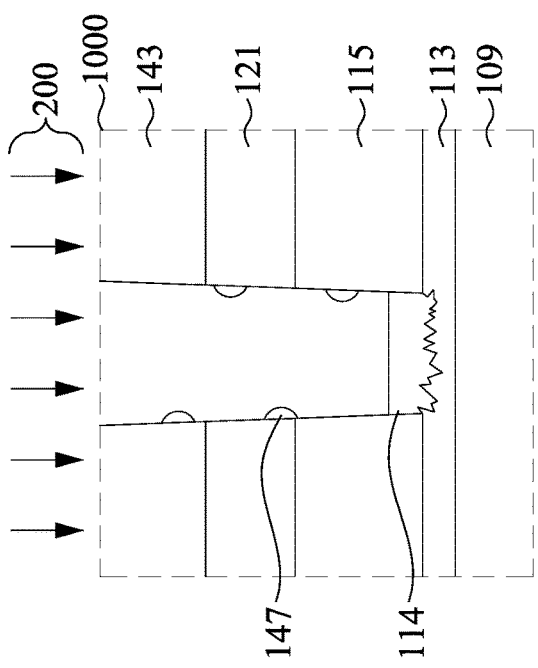

FIGS. 11 and 12 illustrate a seed relocation process to remove the seeds 145 from the sidewalls of the opening 150. FIG. 11 illustrates a treatment process 200, also referred to as a curing process, applied to the seeds 145. The treatment process 200 chemically changes the seeds 145 into cured seeds 147 that may have less adhesion to the sidewalls of the opening 150. This may be useful for a subsequent removal process of the cured seeds 147.

In some embodiments, the treatment process 200 is an oxidation, such as e.g. a treatment with $O_2$ gas, ozone, or oxygen plasma. The oxidation process may chemically change the surfaces of the seeds 145 into cured seeds 147 with oxidized outer surfaces. In some embodiments, the curing process is an $O_2$ treatment performed at a temperature in a range of 113° C. to 120° C., at a pressure in a range of 8 torr to 12 torr, and using a flow rate of $O_2$ in a range of 1500 sccm to 1850 sccm. However, any suitable parameters may be utilized.

After the treatment process 200, the cured seeds 147 have chemically altered outer surfaces and decreased adhesion to the sidewalls of the mask layer 115, the ESL 121, and the IMD layer 143. In some embodiments in which the treatment process 200 is an oxidation, the cured seeds 147 comprise oxidized tungsten such as e.g. $WO_x$ where x is in a range of 1 nm to 4 nm.

FIG. 12 shows a removal process 300 to detach and remove the cured seeds 147 from sidewalls of the opening 150. In some embodiments, the removal process 300 is a multi-rinse process, such as the five step rinse process described below as an example. However, the removal process may have any suitable number of steps in any suitable order.

A first step of the removal process 300 may be a drying pre-rinse step. The drying pre-rinse comprises dispensing a drying material such as isopropyl alcohol (IPA) using a process such as spin-on in order to dry the sidewalls and bottom surface of the opening 150 after the treatment process 200. However, any suitable method and any suitable material may be used to help dry the opening 150.

A second step of the removal process 300 may be a basic solution rinse. For example, in a particular embodiment the second step of the removal process 300 may comprise dispensing a solution comprising ammonium hydroxide and water at a ratio of 1:10 using a process such as a spin-on process. However, any suitable solution and any suitable process may be utilized.

A third step of the removal process 300 may be a rinse with an ozonated deionized water ($DIO_3$) solution, e.g., deionized water (DIW) in which ozone has been dissolved. The $DIO_3$ solution may be formed by oxidation reactants such as by bubbled ozone through DIW, and the ozone may be dissolved in the water such that the ozone concentration is in a range of 5 ppm to 100 ppm. However, any suitable rinse may be utilized.

A fourth step of the removal process 300 may be a rinse with deionized water (DIW), which may remove the cured seeds 147. The DIW rinse may be performed with DIW for a duration in a range of 25 seconds to 60 seconds, at a temperature in a range of 62° C. to 72° C. However, any suitable parameters may be utilized.

A fifth step of the removal process 300 may be a drying post-rinse step. The drying post-rinse comprises dispensing a drying material such as IPA to dry the sidewalls and bottom surface of the opening 150 after the DIW rinse. However, any suitable method of removing remnants of the DIW to dry the opening 150 may be utilized.

Figure 13A:
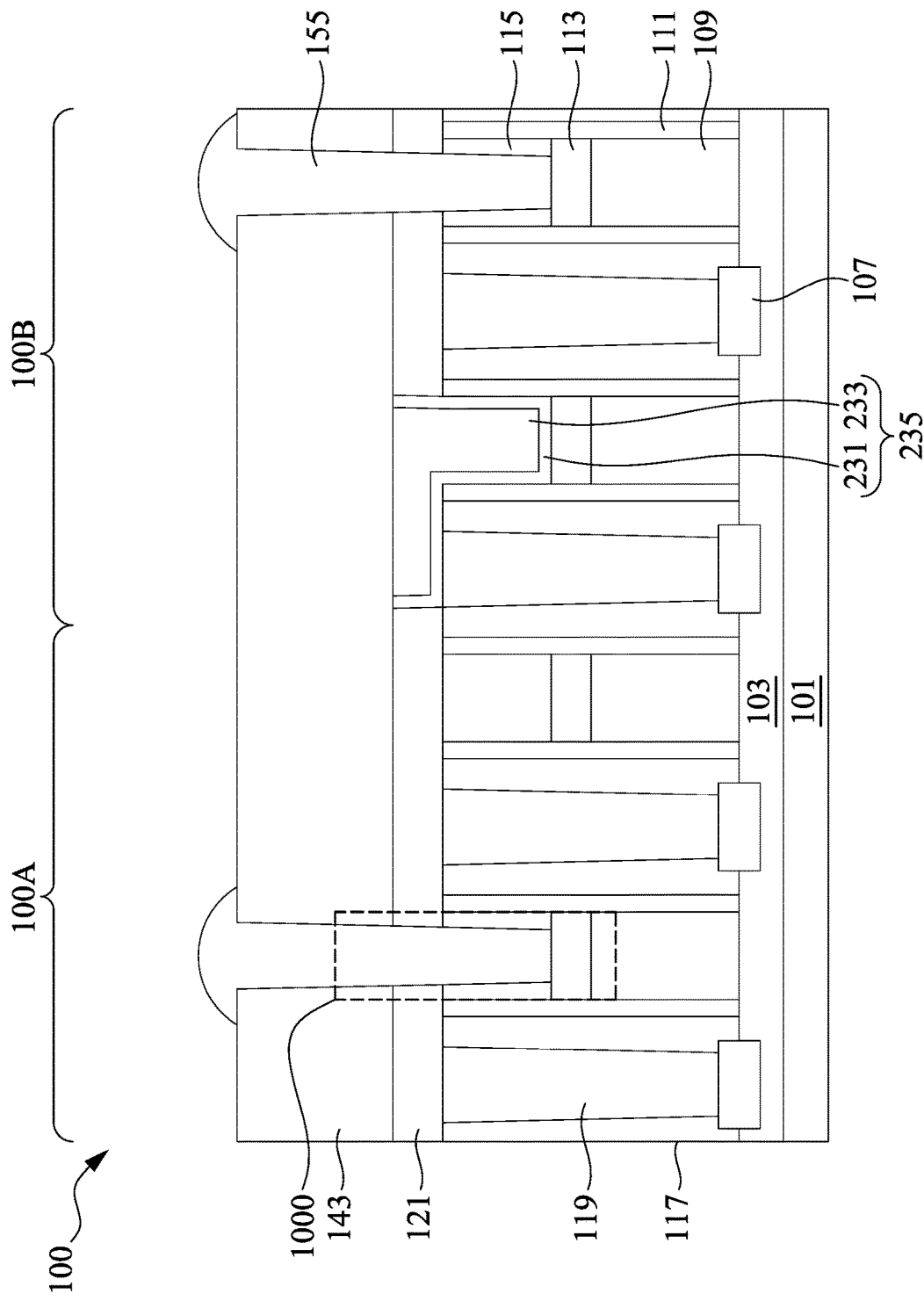
Figure 13B:
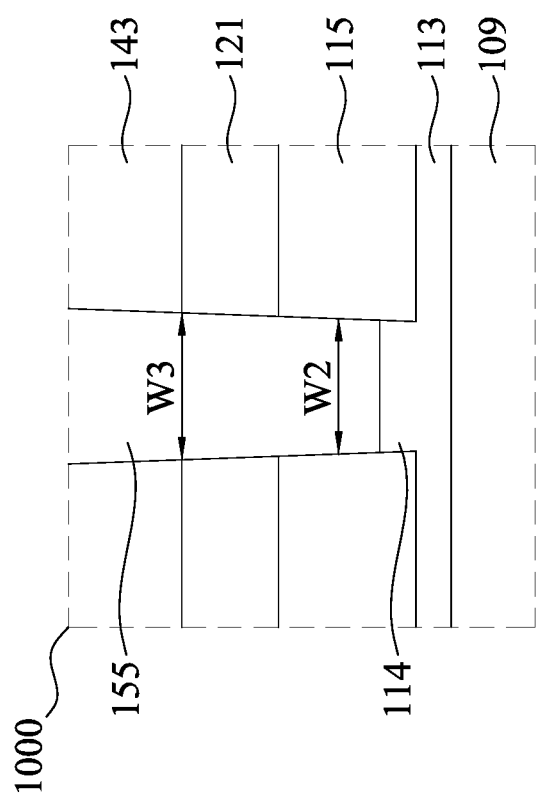

FIGS. 13A and 13B illustrate that, once the removal process 300 has been performed, gate contacts 155, also referred to as conductive vias, are formed in openings 150, with FIG. 13B illustrating a detailed view of region 1000 as shown in FIG. 13A. Prior to the formation of the gate contacts 155, a pre-cleaning may be performed to remove residues and impurities from the openings 150. In some embodiments, the pre-cleaning is a plasma treatment performed using hydrogen ($H_2$), with plasma being turned on.

The gate contacts 155 may comprise a conductive material such as W, Al, Cu, Ti, TiAlN, TaC, TaCN, TaSiN, Mn, Zr, TiN, Ta, TaN, Co, Ni, combinations of these, or the like. In some embodiments, the gate contacts 155 comprise tungsten. The gate contacts 155 may be formed by any suitable method, such as e.g. CVD, plasma-enhanced CVD (PECVD), MOCVD, thermal CVD, PVD, ALD, or the like. In some embodiments, a bottom-up deposition process is performed using a thermal CVD process. The bottom-up deposition process may be performed using $WF_6$ and $H_2$ as process gases (when tungsten is to be grown), and the resulting gate contacts 155 comprise fluorine. In some embodiments, the width W2 of the gate contacts 155 measured across bottom surfaces of the gate contacts 155 is in a range of 8.5 nm to 9.7 nm, and the width W3 of the gate contacts 155 measured level with a top surface of the ESL 121 is in a range of 10.9 nm to 11.6 nm. However, any suitable dimensions may be utilized.

The vertical growth of the gate contacts 155 may be controlled to produce heights of the gate contacts 155 in a range of 48 nm to 67 nm, which may be advantageous for producing gate contacts 155 with a desired height compatible with subsequent planarizations. Gate contacts 155 with heights less than 48 nm may be shorter than a subsequent planarization, which may lead to a subsequently deposited dielectric layer (see below, FIG. 15) covering top surfaces of the gate contacts 155 and decreasing performance. Gate contacts 155 with heights greater than 67 nm may lead to overgrowth on the top surface of the IMD layer 143, which may lead to overburdening of a subsequent planarization. In some embodiments, the proportion of gate contacts 155 formed to heights in the range of 48 nm to 67 nm is in a range of 85% to 90%.

In some embodiments, some of the gate contacts 155 may have convex top portions over a top surface of the IMD layer 143. The convex top portions of the gate contacts 155 may be removed by a subsequent planarization (see below, FIG. 14).

During the formation of the gate contacts 155, the previous removal of the cured seeds 147 from the sidewalls of the openings 150 (see above, FIGS. 11-12) may be useful for decreasing selective loss of conductive material during the formation of the gate contacts 155. In particular, by removing the cured seeds 147, heterogeneous nucleation based around the seeds during the formation of the gate contacts 155 in the openings 150 may be reduced. This may reduce selective loss of the conductive material in the gate contacts 155, such as e.g. tungsten, which may lead to lower resistance and better electrical performance.

The removal process 300 (see above, FIG. 12) may also reduce the amount of carbon and nitrogen that can be found in the gate contacts 155. In some embodiments, a C is signal measured in the subsequently formed vias by X-ray photoelectron spectroscopy (XPS) is in a range of 3.6 to 3.8 counts per second, and an N is signal measured in the subsequently formed vias by XPS is in a range of 3.2 to 3.4 counts per second. A ratio of elemental percentage of fluorine to carbon to nitrogen (F:C:N) measured in the subsequently formed vias by XPS may be in the range of 1.86:0:0 to 3.35:0:0.

Figure 14:
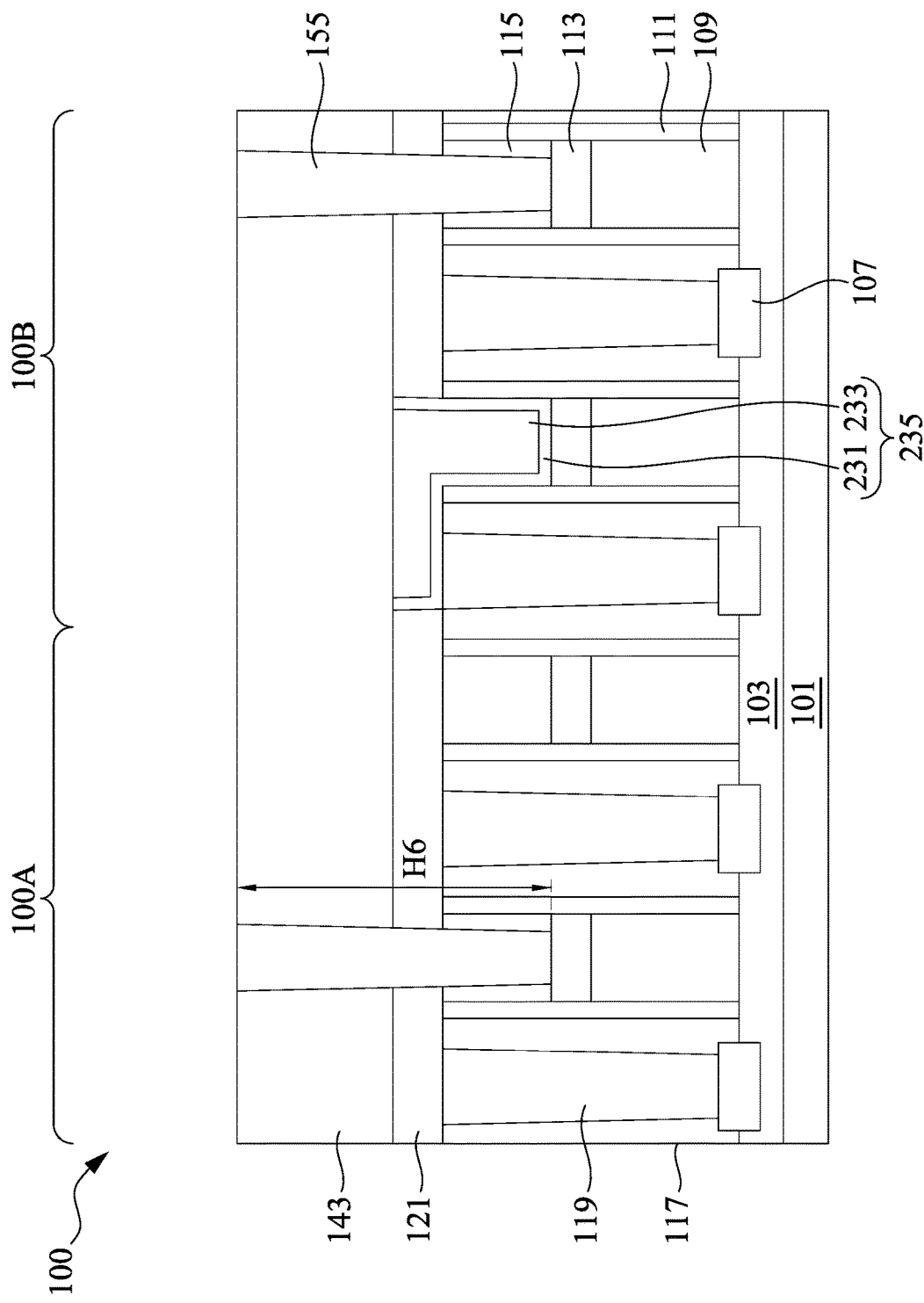

In FIG. 14, the gate contacts 155 are planarized with a top surface of the IMD layer 143. The gate contacts 155 may be planarized by a chemical mechanical polishing (CMP) process, although any suitable process may be utilized. After the planarization, the gate contacts 155 may have a height H6 in a range of 41 nm to 55 nm. However, any suitable dimensions may be utilized.

Figure 15:
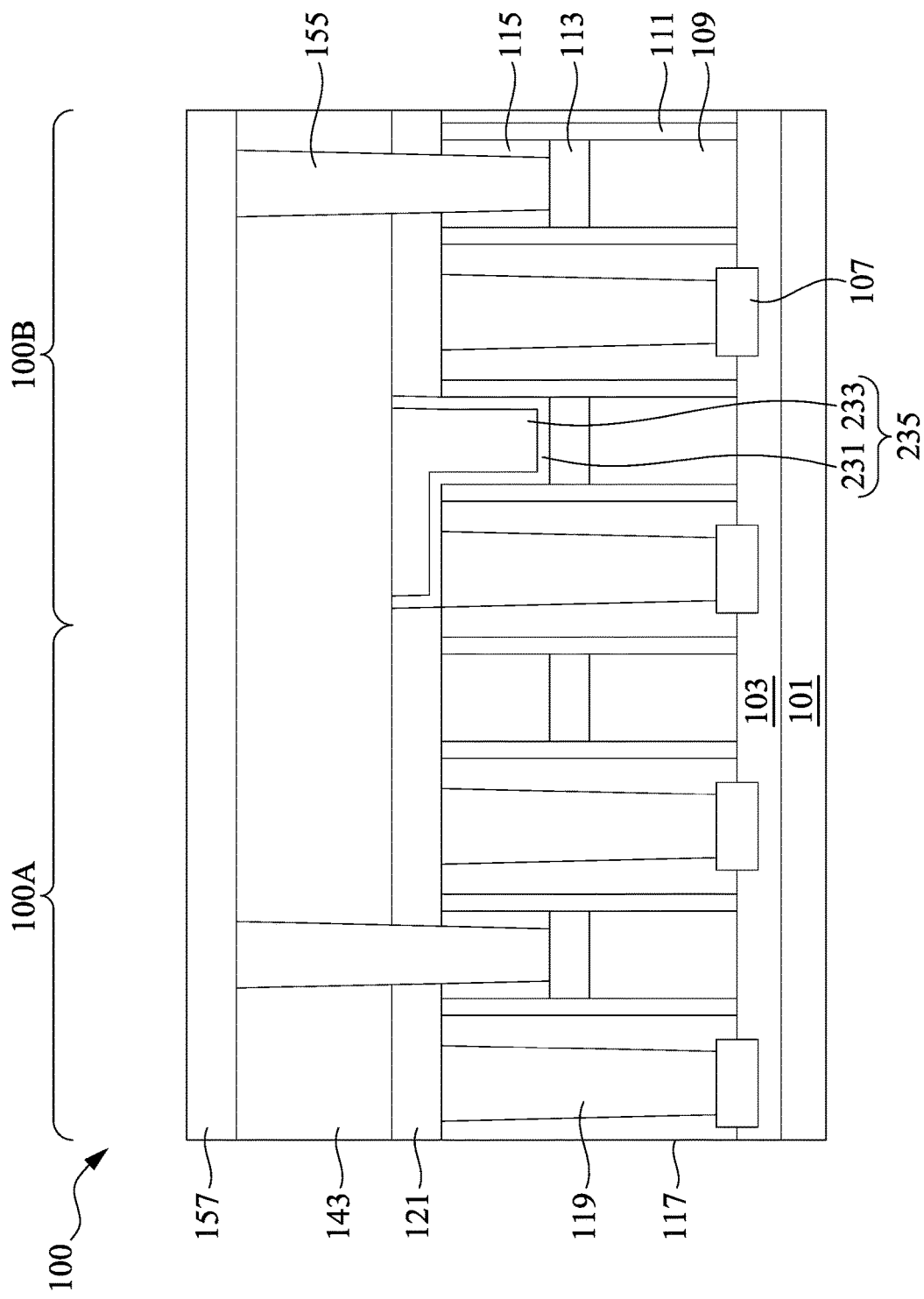

In FIG. 15, an IMD layer 157 is formed over the gate contacts 155 and the IMD layer 143 to replace height lost by the IMD layer 143 in the previous planarization process. The IMD layer 157 may be formed using similar processes and materials as the IMD layer 123 as described above with respect to FIG. 3. However, any suitable processes or materials may be used.

Figure 16:
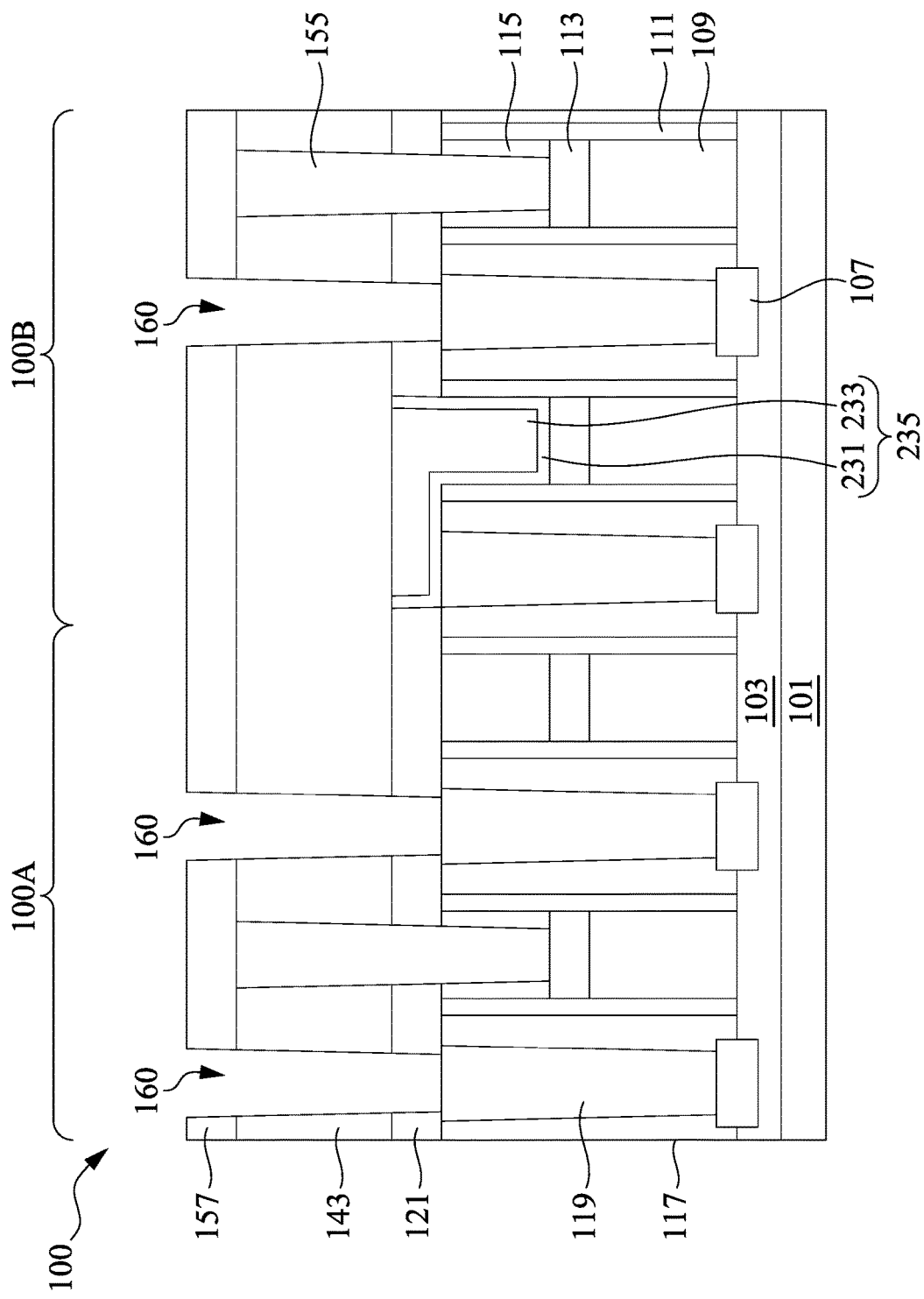

FIG. 16 illustrates the patterning of openings 160 through the IMD layer 157, the IMD layer 143, and the ESL 121 to expose top surfaces of the contact plugs 119 in regions 100A and 100B. The openings 160 may be used to subsequently form conductive contacts coupled to the source/drain regions 107. The openings 160 may be patterned using similar processes as the openings 130 as described above in respect to FIGS. 4 and 5. However, any suitable processes may be used.

Figure 17:
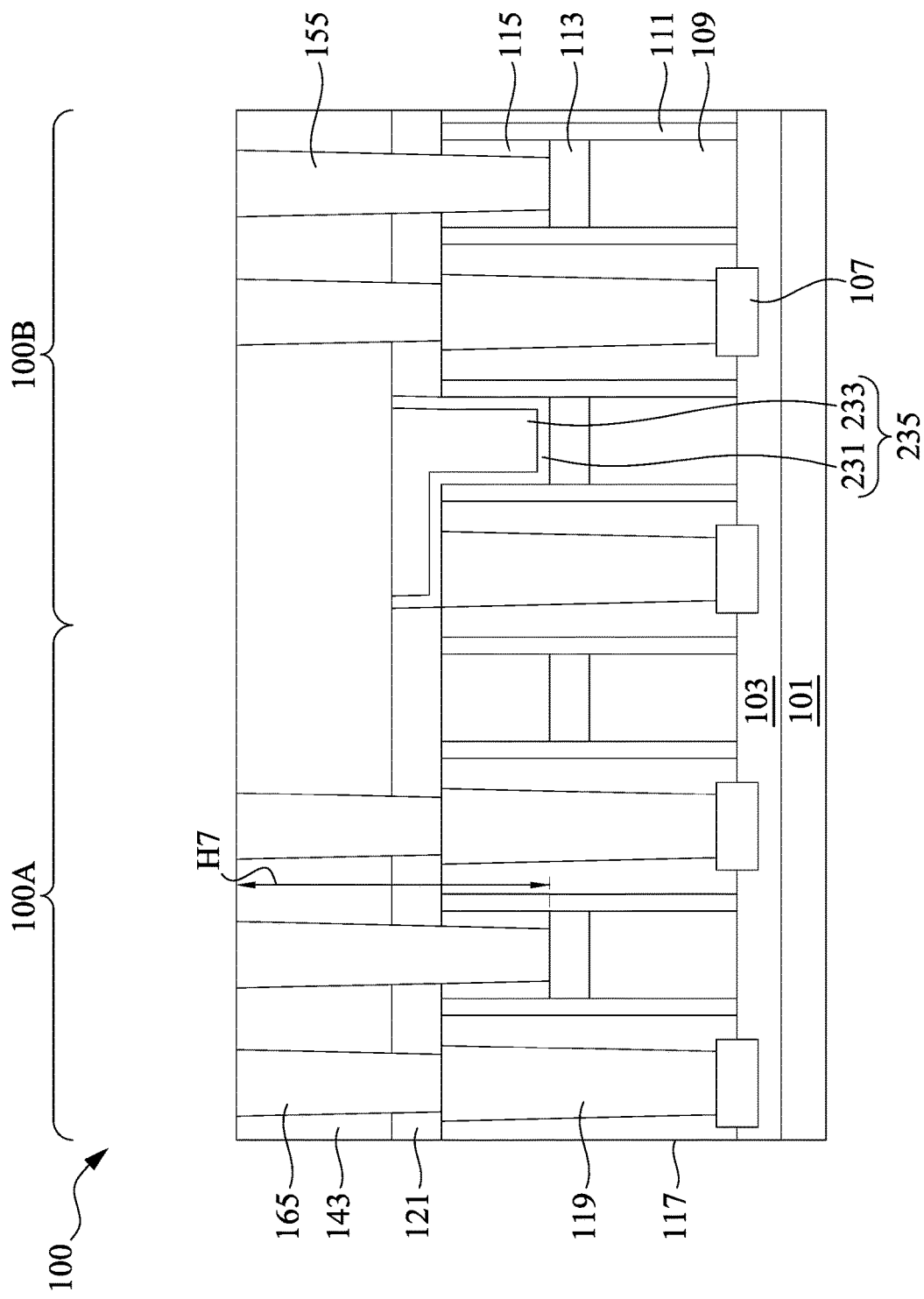

In FIG. 17, conductive contacts 165 are formed in the openings 160. The conductive contacts 165 may electrically couple to the source/drain regions 107 through the contact plugs 119. The conductive contacts 165 may be formed using similar methods and materials as the gate contacts 155 as described above in respect to FIGS. 13A and 13B. For example, in some embodiments the conductive contacts 165 comprise tungsten and are formed with a bottom-up deposition process performed using a thermal CVD process using $WF_6$ and $H_2$ as process gases. However, any suitable methods and materials may be used.

In some embodiments, a germanium implantation process or germanium ion bombardment is performed on top surfaces of the conductive contacts 165. The Ge ion bombardment on the top surfaces of the conductive contacts 165 may be useful for strengthening an interface between the conductive contacts 165 and the IMD layers 157 and 143, which may reduce CMP slurry seeping down through cracks between the conductive contacts 165 and the IMD layers 157 and 143 during a subsequent planarization. This can reduce recessing of upper surfaces of the contact plugs 119 due to etching of the contact plugs 119 by the CMP slurry.

Sacrificial or buffer layers (not illustrated) may be formed over the conductive contacts 165 prior to a planarization process such as a CMP. Because some top surfaces of the conductive contacts 165 may be concave and other top surfaces of the conductive contacts 165 may be convex, the subsequent CMP may trigger underpolishment or overpolishment defects. The sacrificial layers may be formed on the conductive contacts 165 in order to reduce underpolishment or overpolishment defects by overburdening the conductive contacts 165 and as a stop line in CMP processing. In some embodiments, the sacrificial layers comprise one or more layers of Ti, TiN, and tungsten. The sacrificial layers of Ti and TiN may be formed using similar methods and materials as the liner 231 as described above in respect to FIG. 6. The sacrificial layer of tungsten may be formed using similar methods and materials as the conductive contacts 165. However, any suitable methods or materials may be used.

Following the formation of the conductive contacts 165, the conductive contacts 165 may be planarized level with a top surface of the gate contacts 155. The planarization may be a chemical mechanical polishing (CMP) process, although any suitable process may be utilized. The planarization may remove any sacrificial layers formed over the conductive contacts 165. In some embodiments, the planarization removes the IMD layer 157. After the planarization, the gate contacts 155 may have a height H7 in a range of 32 nm to 39 nm, although any suitable dimensions may be utilized.

Removing seeds 145 from the sidewalls of the openings 150 (see above, FIGS. 11-12) may decrease selective loss of conductive material during the formation of the gate contacts 155. Heterogeneous nucleation based around the seeds 145 during the formation of the gate contacts 155 in the openings 150 may be reduced by the removal of the seeds 145, which may lower selective loss of the conductive material in the gate contacts 155, such as e.g. tungsten. This may lead to lower resistance and better electrical performance.

FIGS. 18 through 23 illustrate cross-sectional views showing intermediate stages in the manufacture of another semiconductor device 400. In this embodiment, the semiconductor device 400 is similar to the semiconductor device 100 described above in reference to FIGS. 2 through 17, where like reference numerals indicate like elements formed using like processes. Embodiments of the semiconductor device 400 and the manufacturing thereof may differ from embodiments of the semiconductor device 100 and the manufacturing thereof by, e.g., the positions, shapes, and orders of formation of respective conductive contacts.

Figure 18:
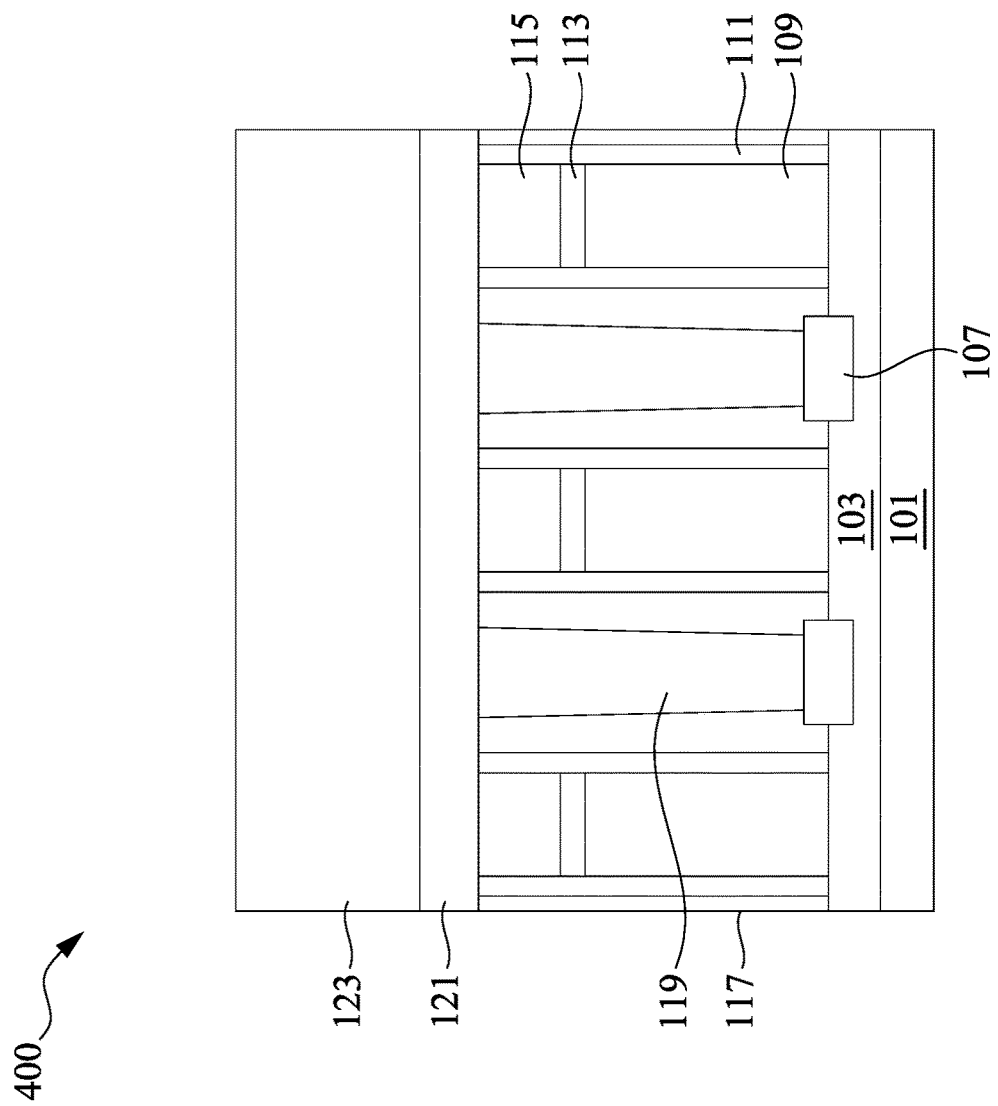
FIGS. 18 through 23 illustrate cross-sectional views of a semiconductor device at intermediate stages of manufacturing, in accordance with some embodiments.

FIG. 18 illustrates the semiconductor device 400 at an intermediate stage of manufacture similar to the semiconductor device 100 as shown above in FIG. 3, and may be formed using similar methods and materials as the semiconductor device 100 as described in respect to FIG. 3. However, any suitable materials and processes may be used.

Figure 19:
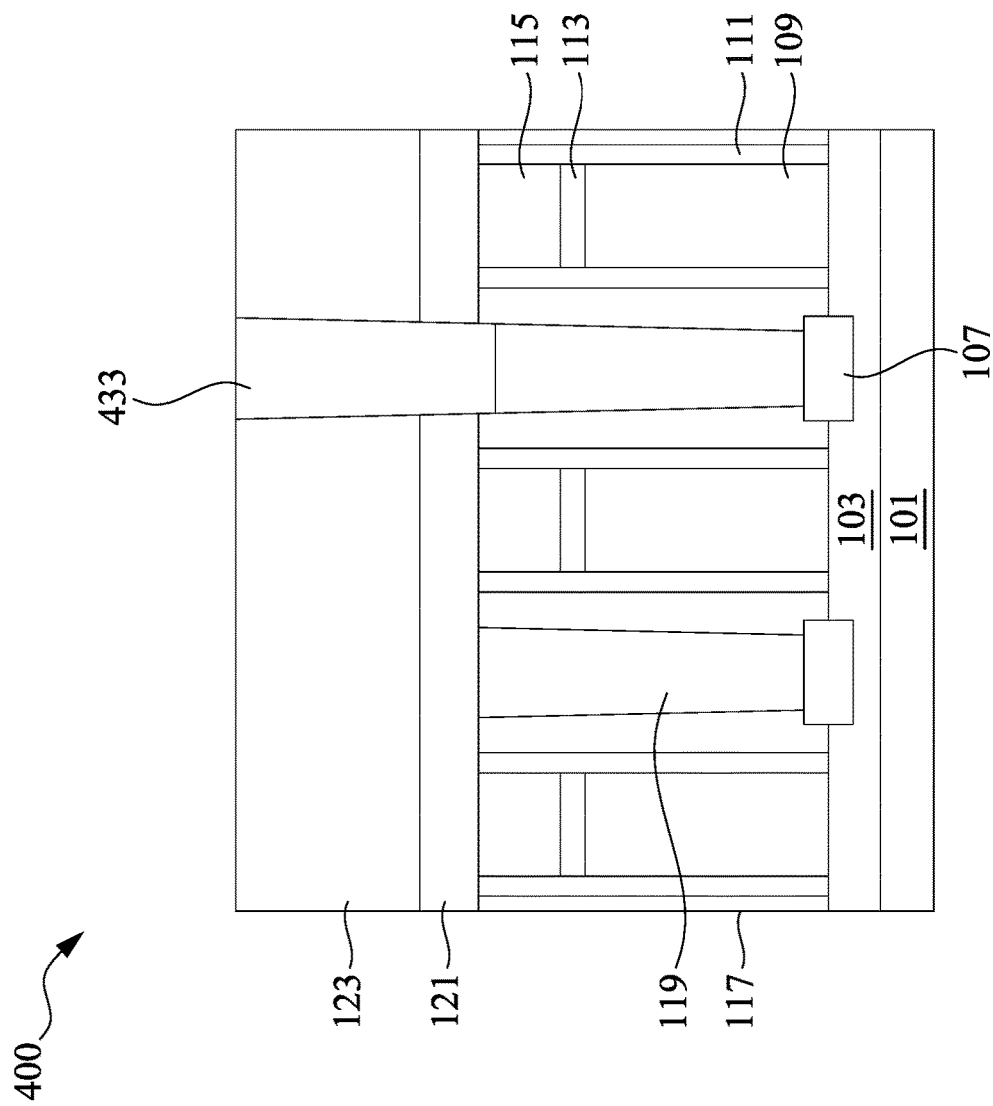

In FIG. 19, a conductive contact 433 is formed through the IMD layer 123 and the ESL 121 to electrically couple to the source/drain region 107 through the contact plugs 119. In some embodiments, the conductive contact 433 is formed using similar methods and materials as the conductive contacts 165 as described above in respect to FIGS. 16 and 17. For example, openings may be formed and then filled with conductive material. However, any suitable methods and materials may be used.

Additionally, in some embodiments, the formation of the conductive contact 433 may include over-etching into top surfaces of the contact plug 119. For example, the top surface of the contact plug 119 may be recessed by a wet clean performed after the etching through the IMD layer 123 and the ESL 121 for the subsequent formation of the conductive contact 433. The contact plug 119 may comprise cobalt and the etching and ashing steps of forming the opening for the conductive contact 433 may convert top portions of the contact plug 119 to cobalt fluoride. The wet clean may be performed with DIW, which may react with the cobalt fluoride and remove a portion of the contact plug 119 at the top surface, recessing it. The conductive contact 433 may fill the recess formed in the top surface of the contact plug 119.

Figure 20:
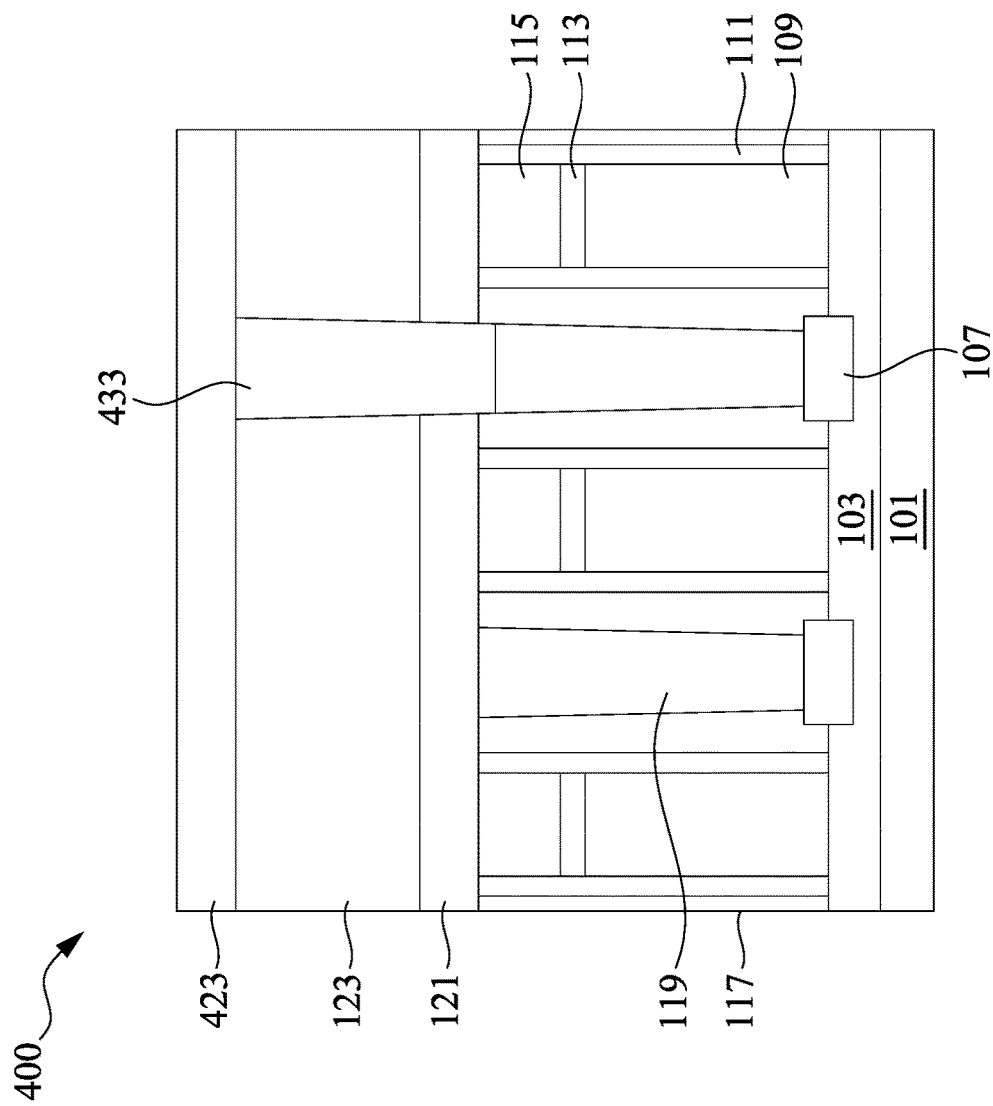

In FIG. 20, an IMD layer 423 is formed over the conductive contact 433 and the IMD layer 123. The IMD layer 423 may replace height lost by the IMD layer 123 in a previous planarization process performed after forming the conductive contact 433. The IMD layer 157 may be formed using similar processes and materials as the IMD layer 123 as described above with respect to FIG. 3. However, any suitable processes or materials may be used.

Figure 21:
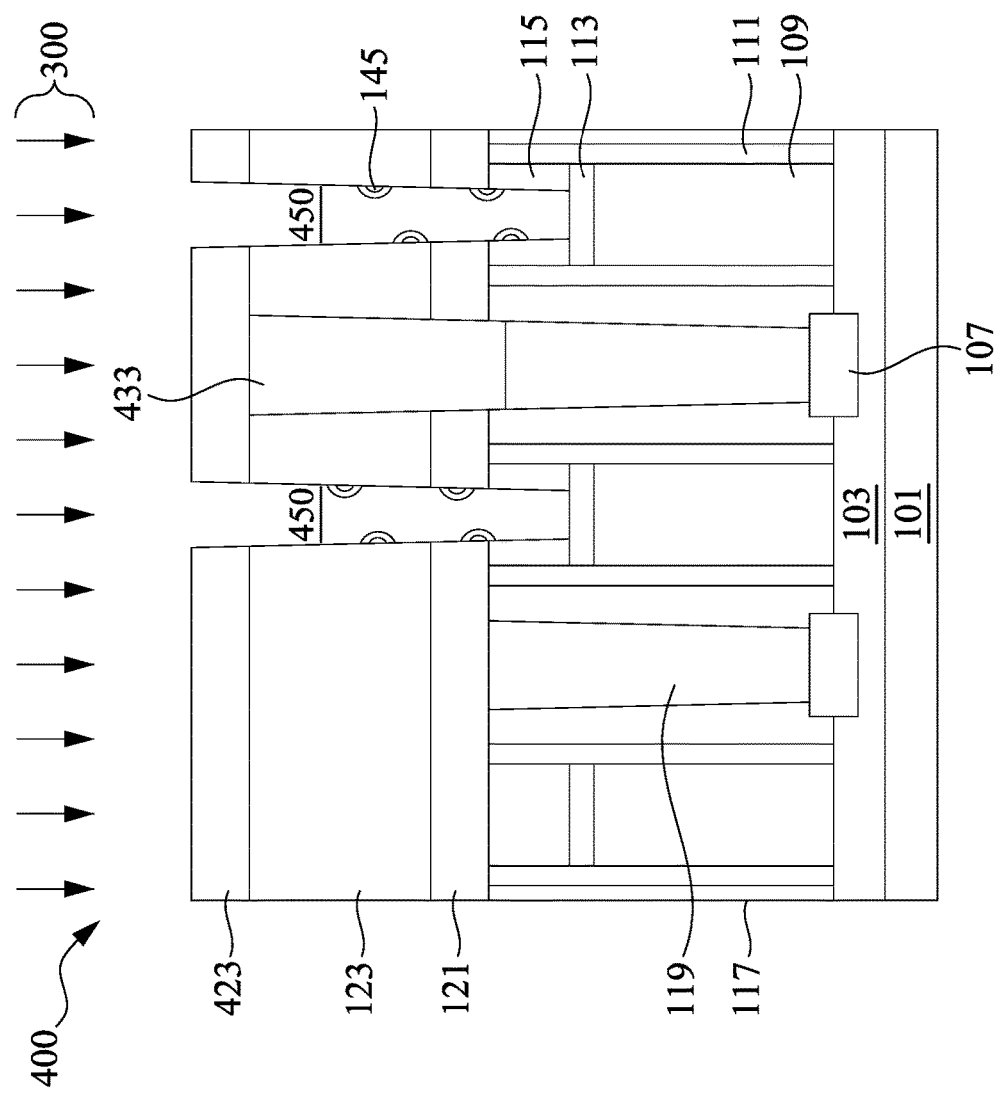

In FIG. 21, openings 450 are patterned through the IMD layer 423, the IMD layer 123, the ESL 121, and the mask layer 115 to expose top surfaces of the capping layers 113. The openings 450 may be formed using similar methods as the openings 150 as described in respect to FIGS. 9A and 9B above. However, any suitable methods may be used.

After forming the openings 450, additional capping layers 114 (not illustrated) may be formed on bottom surfaces of the openings 450 using similar methods and materials as the additional capping layers 114 as described above in respect to FIG. 10. In order to remove seeds 145 left on sidewalls of the openings 450 by the formation of the additional capping layers 114, a seed relocation process may be performed. The seed relocation process may use similar methods as described above in respect to FIGS. 11 and 12, such as the treatment process 200 (not separately illustrated in FIG. 21) and the removal process 300 (which is illustrated in FIG. 21).

Figure 22:
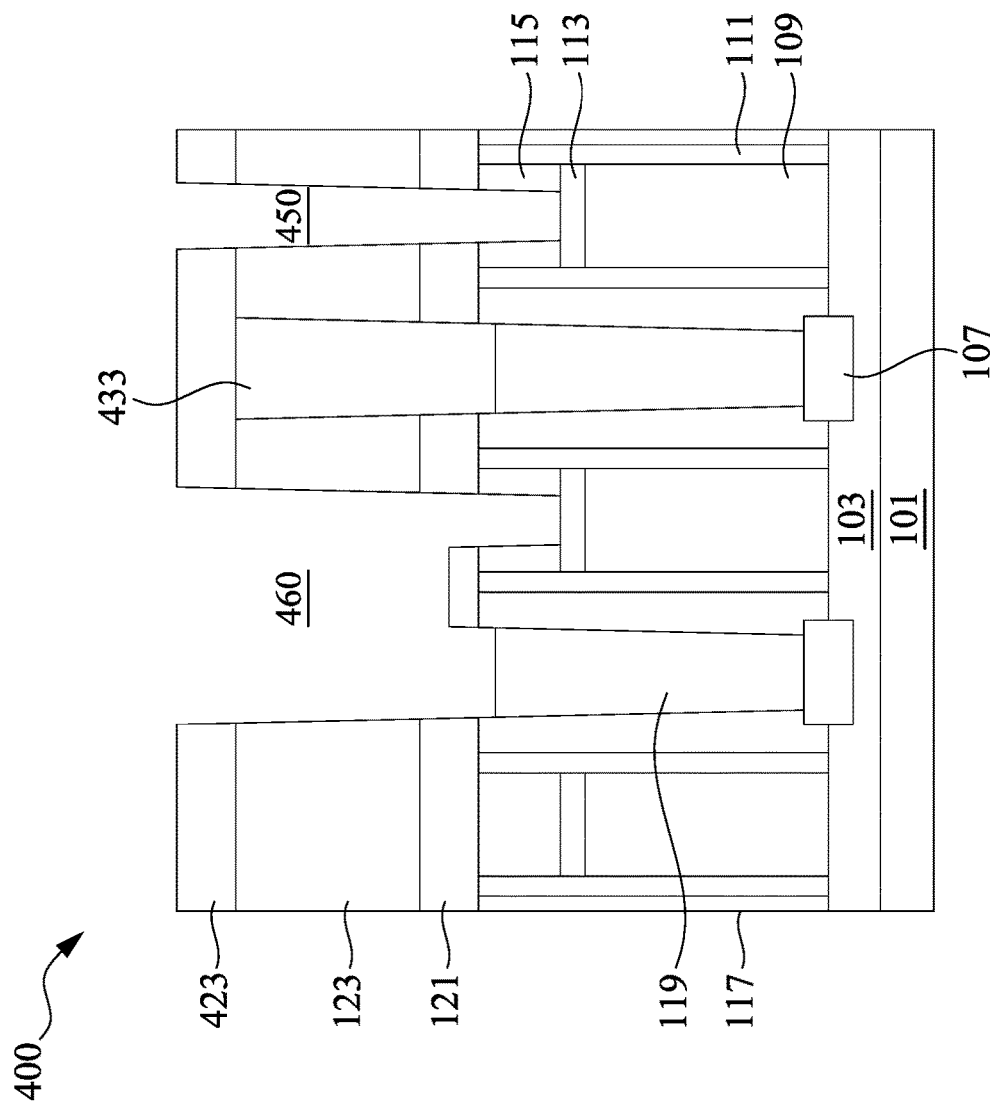

In FIG. 22, an opening 460 may be formed by patterning and etching through the IMD layers 423 and 123 and the ESL 121. The opening 460 may be formed using similar methods and materials as the opening 130 as described above in respect to FIG. 5. In some embodiments, the opening 460 is formed by widening an opening 450 so that the opening 460 exposes top surfaces of a contact plug 119 and an adjacent capping layer 113 over a gate structure 109.

Additionally, in some embodiments, the top surface of the contact plug 119 is recessed after the etching of the opening 460. The recession of the contact plug 119 may be performed using similar materials and methods as described above for the formation of the conductive contact 433 in respect to FIG. 19. However, any suitable methods and materials may be used.

Figure 23:
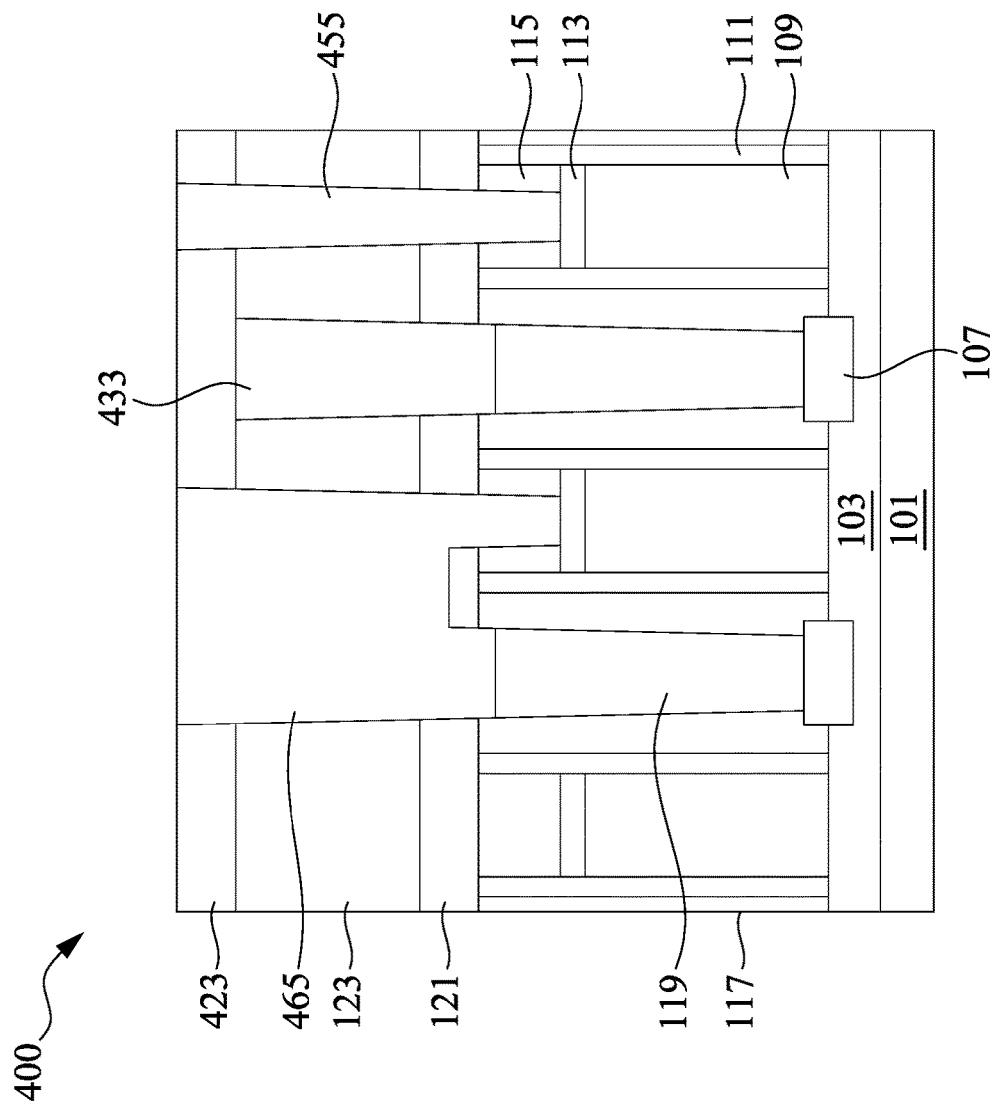

In FIG. 23, conductive contact 455 and conductive contact 465 are formed in the opening 450 and opening 460, respectively. The conductive contact 455 and conductive contact 465 may be formed using similar methods and materials as the gate contacts 155 as described above in respect to FIGS. 13A and 13B. For example, in some embodiments the conductive contacts 455 and 465 comprise tungsten and are formed with a bottom-up deposition process performed using a thermal CVD process using $WF_6$ and $H_2$ as process gases. However, any suitable methods and materials may be used. In some embodiments, the conductive contact 465 is a butted contact that is electrically coupled to the gate electrode of the gate structure 109 and the source/drain region 107 through the capping layer 113 and the contact plug 119, respectively.

Embodiments may achieve advantages. A seed relocation process may remove seeds from sidewalls of openings and reduce selective loss in subsequently formed vias. The seeds may be oxidized by a curing process. A subsequent rinse including deionized water may be efficient in removing the oxidized seeds left along the sidewalls by an earlier deposition process. The rinse process may also reduce the proportions of trace carbon and nitrogen left in the via.

In accordance with an embodiment, a method of forming a semiconductor device includes: forming a first conductive feature on a bottom surface of an opening through a dielectric layer, the forming the first conductive feature leaving seeds on sidewalls of the opening; performing a treatment process on the seeds to form treated seeds; removing the treated seeds with a cleaning process; and forming a second conductive feature to fill the opening. In an embodiment, the cleaning process includes a rinse with deionized water. In an embodiment, the cleaning process further includes a rinse with isopropyl alcohol after the rinse with deionized water. In an embodiment, the treatment process includes an oxidation. In an embodiment, the forming the first conductive feature includes a fluorine free tungsten deposition. In an embodiment, the forming the second conductive feature includes using a fluorine-including precursor. In an embodiment, the method further includes forming a third conductive feature, the opening extending to a top surface of the third conductive feature, the first conductive feature and the third conductive feature being the same material.

In accordance with another embodiment, a method of forming a semiconductor device includes: forming a first conductive feature on a gate electrode; forming a dielectric layer over the first conductive feature; etching an opening extending through the dielectric layer to expose the first conductive feature; forming a second conductive feature on a bottom surface of the opening, wherein a residue is formed on sidewalls of the opening; oxidizing the residue with an oxygen treatment; performing a cleaning process to remove the residue, the cleaning process including a rinse with deionized water; and filling the opening with a conductive material. In an embodiment, the forming the first conductive feature and the forming the second conductive feature include respective fluorine free tungsten deposition processes. In an embodiment, the method further includes performing a plasma treatment on the first conductive feature after etching the opening. In an embodiment, the plasma treatment includes an $H_2$ plasma treatment and an $O_2$ plasma treatment. In an embodiment, the method further includes: forming a mask layer over the first conductive feature, the mask layer including a first material; and forming an etch stop layer over the first conductive feature, etch stop layer including the first material. In an embodiment, the etching the opening includes an anisotropic plasma etch and a wet etch.

In yet another embodiment, a method of forming a semiconductor device includes: patterning an opening to expose a top surface of a first tungsten feature, the opening extending through a mask on the first tungsten feature, an etch stop layer (ESL) on the mask, and an inter-metal dielectric (IMD) over the ESL; depositing a second tungsten feature in the opening with a first deposition process, the first deposition process being free of fluorine, the first deposition process leaving tungsten seeds on sidewalls of the opening; performing a seed relocation process, the seed relocation process including: oxidizing the tungsten seeds with a plasma process to form oxidized tungsten seeds; and removing the oxidized tungsten seeds with a rinsing process, the rinsing process including deionized water; and forming a contact by filling the opening with a second deposition process, the second deposition process including tungsten and fluorine. In an embodiment, the rinsing process further includes an isopropyl alcohol pre-rinse and an isopropyl alcohol post-rinse. In an embodiment, the rinsing process further includes an $NH_4OH$ treatment. In an embodiment, the rinsing process further includes an ozonated deionized water rinse. In an embodiment, the first deposition process includes chlorine. In an embodiment, the contact has a C is signal in a range of 3.6 counts per second to 3.8 counts per second. In an embodiment, the contact has a N is signal in a range of 3.2 counts per second to 3.4 counts per second.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first conductive feature on a bottom surface of an opening through a dielectric layer, the forming the first conductive feature leaving seeds on sidewalls of the opening;
    performing a treatment process on the seeds to form treated seeds, wherein the treatment process comprises an oxidation;
    removing the treated seeds with a cleaning process; and
    forming a second conductive feature to fill the opening.

2. The method of claim 1, wherein the cleaning process comprises a rinse with deionized water.

3. The method of claim 2, wherein the cleaning process further comprises a rinse with isopropyl alcohol after the rinse with deionized water.

4. The method of claim 1, wherein the forming the first conductive feature comprises a fluorine free tungsten deposition.

5. The method of claim 1, wherein the forming the second conductive feature comprises using a fluorine-comprising precursor.

6. The method of claim 1, further comprising forming a third conductive feature, the opening extending to a top surface of the third conductive feature, the first conductive feature and the third conductive feature being the same material.

7. The method of claim 1, wherein the treated seeds comprise oxidized tungsten.

8. A method of forming a semiconductor device, the method comprising:
    forming a first conductive feature on a gate electrode with a first fluorine free tungsten deposition process;
    forming a dielectric layer over the first conductive feature;
    etching an opening extending through the dielectric layer to expose the first conductive feature;
    forming a second conductive feature on a bottom surface of the opening with a second fluorine free tungsten deposition process, wherein a residue is formed on sidewalls of the opening;
    oxidizing the residue with an oxygen treatment;
    performing a cleaning process to remove the residue, the cleaning process comprising a rinse with deionized water; and
    filling the opening with a conductive material.

9. The method of claim 8, further comprising performing a plasma treatment on the first conductive feature after etching the opening.

10. The method of claim 9, wherein the plasma treatment comprises an H2 plasma treatment and an $O_2$ plasma treatment.

11. The method of claim 8, further comprising:
    forming a mask layer over the first conductive feature, the mask layer comprising a first material; and
    forming an etch stop layer over the first conductive feature, etch stop layer comprising the first material.

12. The method of claim 8, wherein the etching the opening comprises an anisotropic plasma etch and a wet etch.

13. The method of claim 8, wherein the oxygen treatment is performed at a temperature in a range of 113° C. to 120° C.

14. A method of forming a semiconductor device, the method comprising:
    patterning an opening to expose a top surface of a first tungsten feature, the opening extending through a mask on the first tungsten feature, an etch stop layer (ESL) on the mask, and an inter-metal dielectric (IMD) over the ESL;
    depositing a second tungsten feature in the opening with a first deposition process, the first deposition process being free of fluorine, the first deposition process leaving tungsten seeds on sidewalls of the opening;
    performing a seed relocation process, the seed relocation process comprising:
        oxidizing the tungsten seeds with a plasma process to form oxidized tungsten seeds; and
        removing the oxidized tungsten seeds with a rinsing process, the rinsing process comprising deionized water; and
    forming a contact by filling the opening with a second deposition process, the second deposition process comprising tungsten and fluorine.

15. The method of claim 14, wherein the rinsing process further comprises an isopropyl alcohol pre-rinse and an isopropyl alcohol post-rinse.

16. The method of claim 14, wherein the rinsing process further comprises an $NH_4OH$ treatment.

17. The method of claim 14, wherein the rinsing process further comprises an ozonated deionized water rinse.

18. The method of claim 14, wherein the first deposition process comprises chlorine.

19. The method of claim 14, wherein the contact has a C 1s is signal in a range of 3.6 counts per second to 3.8 counts per second.

20. The method of claim 19, wherein the contact has a N 1s is signal in a range of 3.2 counts per second to 3.4 counts per second.

* * * * *

UNITED STATES PATENT AND TRADEMARK OFFICE
CERTIFICATE OF CORRECTION

PATENT NO. : 11,670,499 B2
APPLICATION NO. : 17/205847
DATED : June 6, 2023
INVENTOR(S) : Chang et al.

It is certified that error appears in the above-identified patent and that said Letters Patent is hereby corrected as shown below:

In the Claims

In Column 16, Claim 19, Line 47, after "1s" delete "is".

In Column 16, Claim 20, Line 50, after "1s" delete "is".

Signed and Sealed this
Twenty-ninth Day of August, 2023

Katherine Kelly Vidal
*Director of the United States Patent and Trademark Office*